(12) United States Patent
Konno

(10) Patent No.: US 8,349,624 B2
(45) Date of Patent: Jan. 8, 2013

(54) METHOD FOR FABRICATING SEMICONDUCTOR DEVICE

(75) Inventor: Yoshito Konno, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/908,262

(22) Filed: Oct. 20, 2010

(65) Prior Publication Data
US 2011/0097828 A1   Apr. 28, 2011

(30) Foreign Application Priority Data
Oct. 26, 2009   (JP) ................. 2009-245100

(51) Int. Cl.
*H01L 21/82* (2006.01)
(52) U.S. Cl. .............. 438/16; 382/151; 257/E21.602
(58) Field of Classification Search .......... 438/16, 438/462; 257/E21.602, E21.499; 356/237.5; 382/151
See application file for complete search history.

(56) References Cited

U.S. PATENT DOCUMENTS
2003/0162368 A1* 8/2003 Connell et al. ............ 438/465
2007/0098900 A1* 5/2007 Abe et al. .................. 427/261
2010/0117084 A1* 5/2010 Konno et al. ................ 257/48

FOREIGN PATENT DOCUMENTS
JP          2006-339211 A     12/2006
WO    WO-2009022401 A1 *   2/2009

* cited by examiner

*Primary Examiner* — Julio J Maldonado
*Assistant Examiner* — Daniel Shook
(74) *Attorney, Agent, or Firm* — Fujitsu Patent Center

(57) ABSTRACT

A method of manufacturing a semiconductor device, includes providing a mark above a main surface on a semiconductor substrate, separating the semiconductor substrate into a plurality of semiconductor elements by cutting the semiconductor substrate, determining a reference semiconductor element on the basis of a coordinate data indicating coordinates of the mark and coordinates of all of the semiconductor elements on the semiconductor substrate, and picking-out the semiconductor elements on the basis of the coordinate data using a pick-out apparatus. The providing operation includes forming a protective coat onto the main surface of the semiconductor substrate, irradiating a point on the main surface of the semiconductor substrate with a laser beam through the protective coat, and eliminating the protective coat from the main surface of the semiconductor substrate.

8 Claims, 25 Drawing Sheets

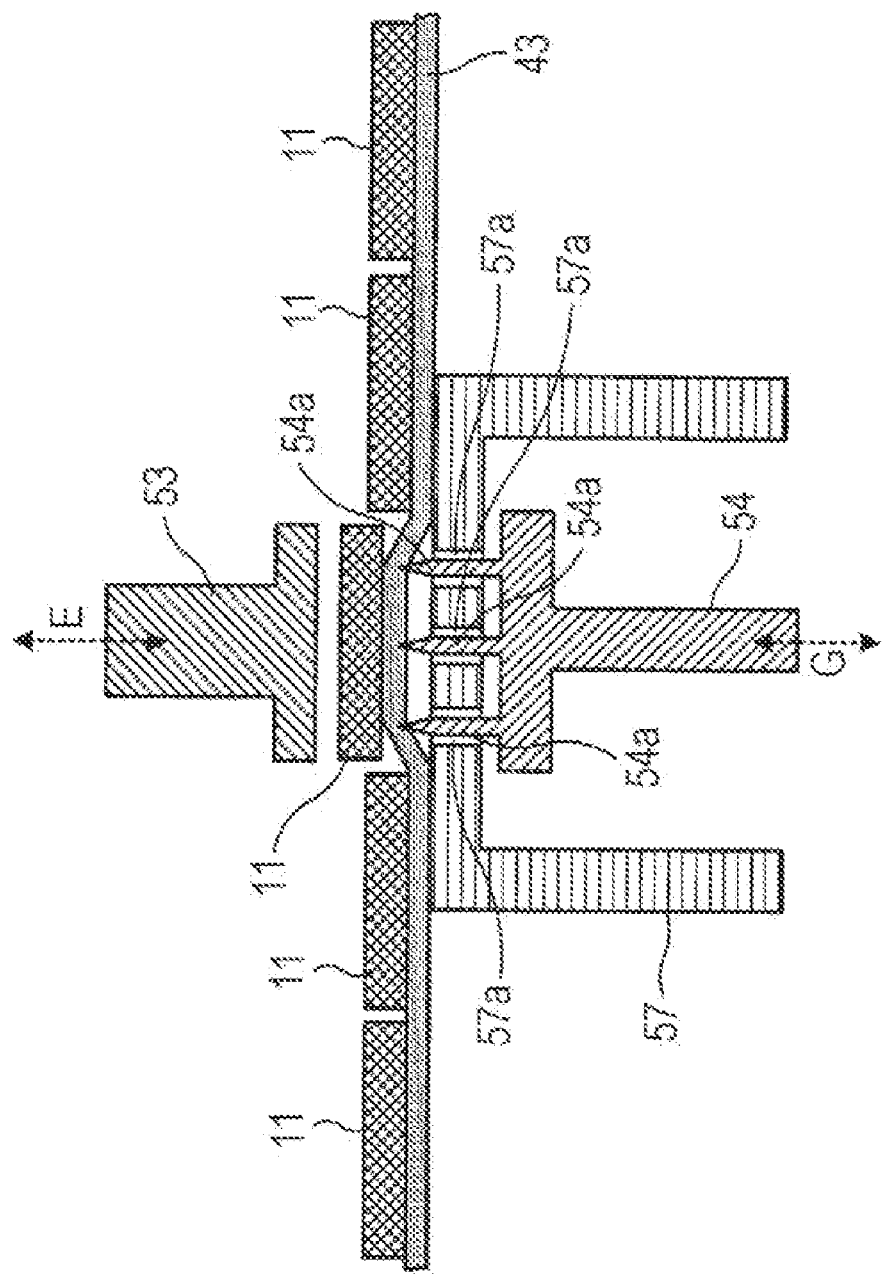

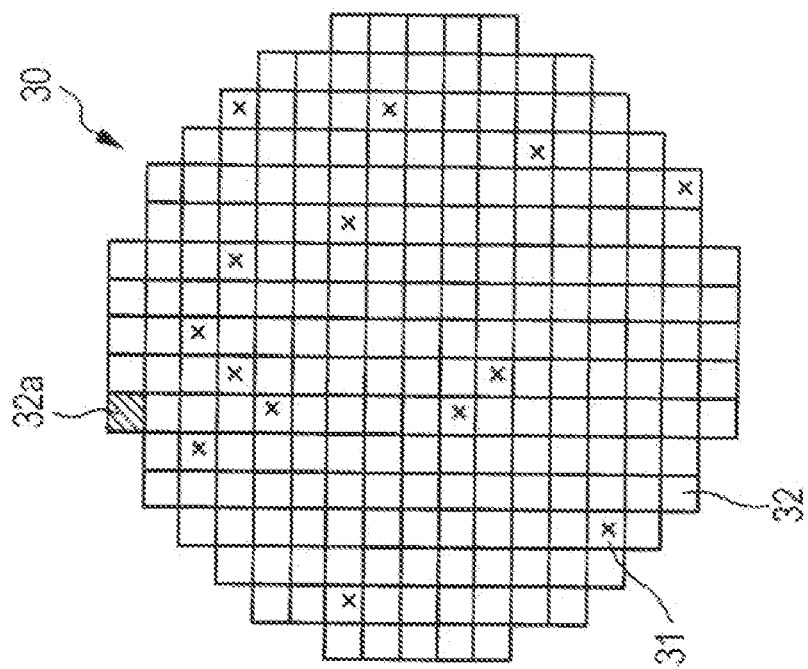
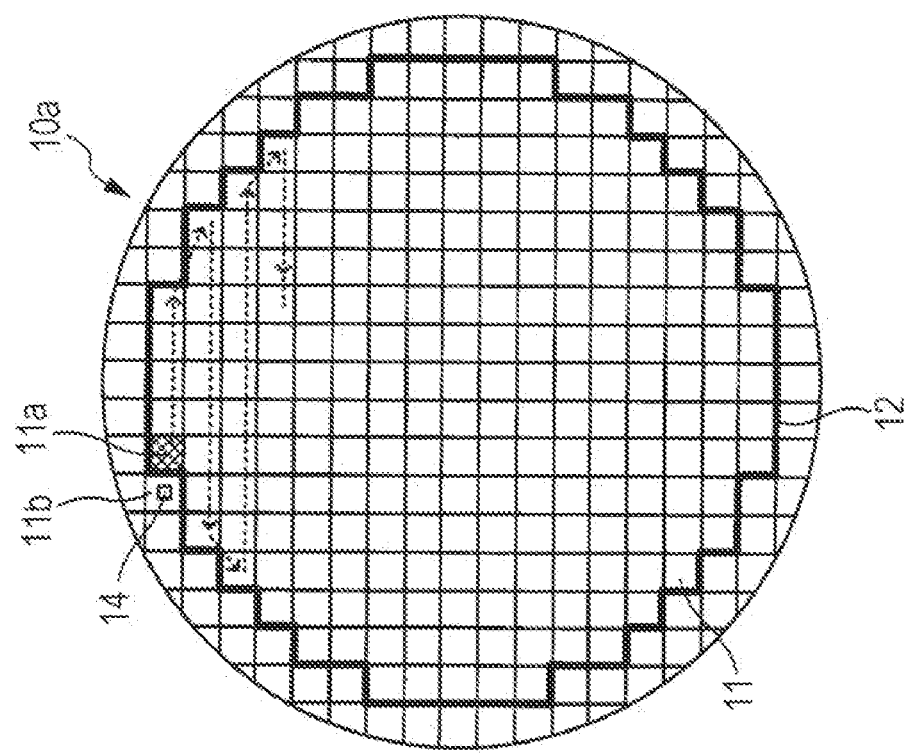

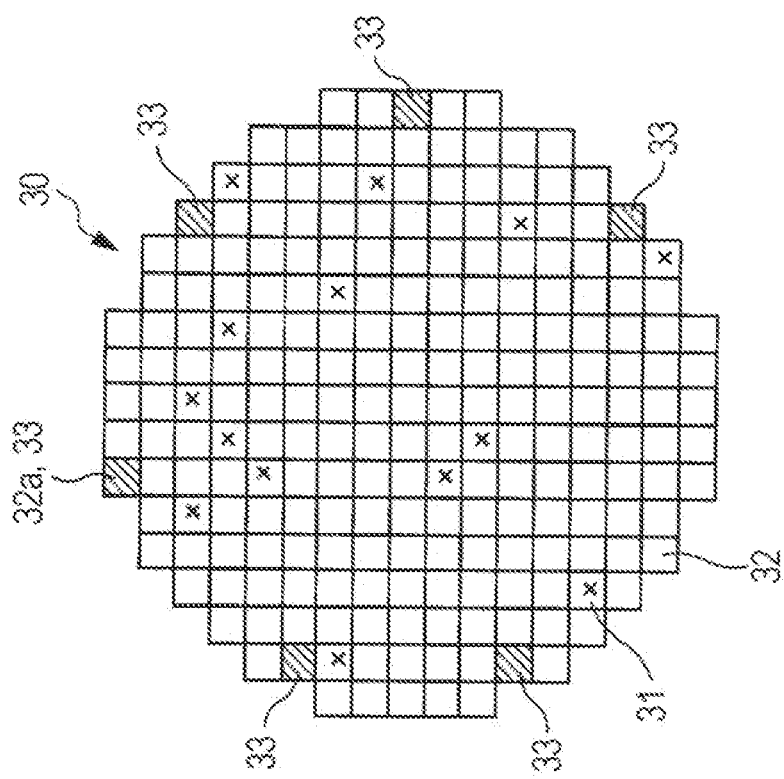
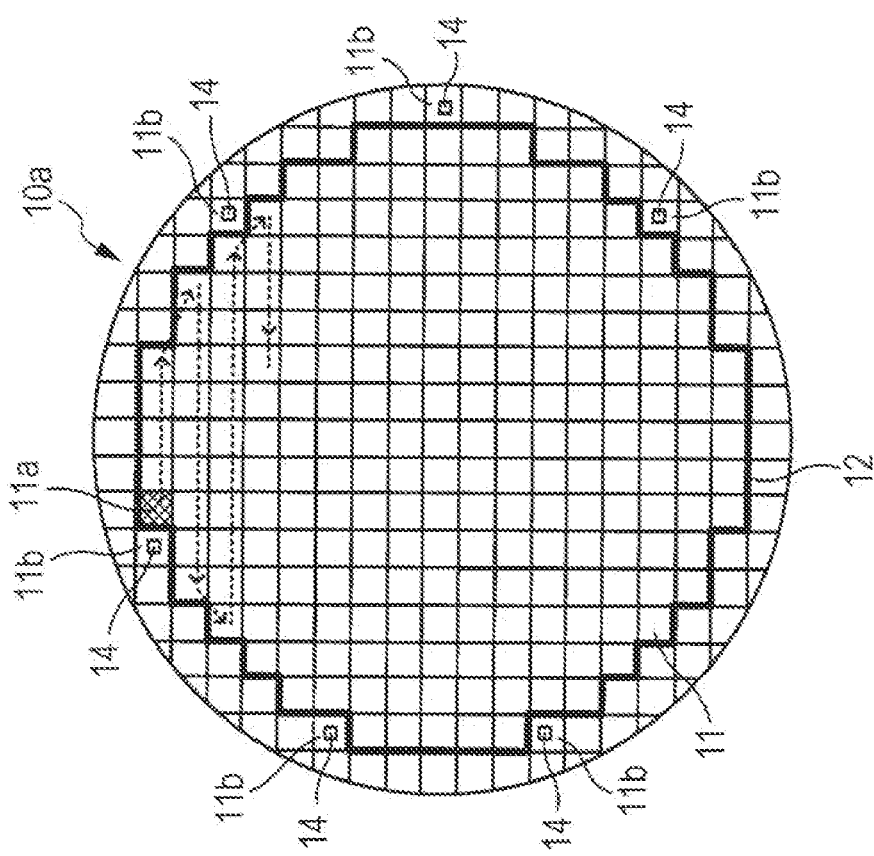
FIG. 20A
FIG. 20B

METHOD FOR FABRICATING SEMICONDUCTOR DEVICE

CROSS-REFERENCE TO RELATED APPLICATION

This application is based upon and claims the benefit of priority from the prior Japanese Patent Application No. 2009-245100 filed on Oct. 26, 2009, the entire contents of which are incorporated herein by reference.

FIELD

The present embodiments relates to a method for fabricating a semiconductor device and more particularly to a method for selectively sorting out non-defective semiconductor devices or defective semiconductor devices from among a plurality of semiconductor devices formed on a semiconductor substrate.

BACKGROUND

A plurality of semiconductor devices ("semiconductor chips" or "chips") formed on a single semiconductor substrate are subject to a characteristic measurement and are sorted into non-defectives or defectives.

The semiconductor substrate is diced into individual semiconductor devices, from which non-defective ones are sorted out selectively. The non-defective semiconductor devices which are sorted out are sent to subsequent processes.

A known method for sorting out non-defectives or defectives from among a plurality of semiconductor devices formed on a semiconductor substrate includes providing markings by, for example, ink dots on semiconductor devices that are determined to be defective through a characteristic measurement.

Another known approach to selectively sorting out and obtain individuated non-defective or defective semiconductor devices adopts usage of data including position information of the non-defective and defective semiconductor devices generated through a characteristic measurement or the like. In this approach, no marking is provided on the semiconductor devices.

For example, the semiconductor devices are distinguished in the following manner: data including position information of the non-defective and defective semiconductor devices generated through a characteristic measurement or the like is displayed on a protective film attached to a surface of a semiconductor substrate; the displayed data is read and used for the sorting out of the semiconductor devices after a dicing process.

SUMMARY

According to an aspect of the embodiment, a method of manufacturing a semiconductor device, includes providing a mark on a main surface on a semiconductor substrate, separating the semiconductor substrate into a plurality of semiconductor elements by cutting the semiconductor substrate, determining a reference semiconductor element on the basis of a coordinate data indicating coordinates of the mark and coordinates of all of the semiconductor elements on the semiconductor substrate, and picking-out the semiconductor elements on the basis of the coordinate data using a pick-out apparatus. The providing operation includes forming a protective coat onto the main surface of the semiconductor substrate, irradiating a point on the main surface of the semiconductor substrate with a laser beam through the protective coat, and eliminating the protective coat from the main surface of the semiconductor substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 14 is a sectional view of main part of a pick-out apparatus illustrating a process of ejecting a semiconductor device upward;

FIG. 18A illustrates an exemplary individuated semiconductor substrate and FIG. 18B illustrates exemplary map data according to a first embodiment;

FIG. 20A illustrates an exemplary individuated semiconductor substrate and FIG. 20B illustrates exemplary map data according to a second embodiment;

DESCRIPTION OF EMBODIMENTS

Figure 1:
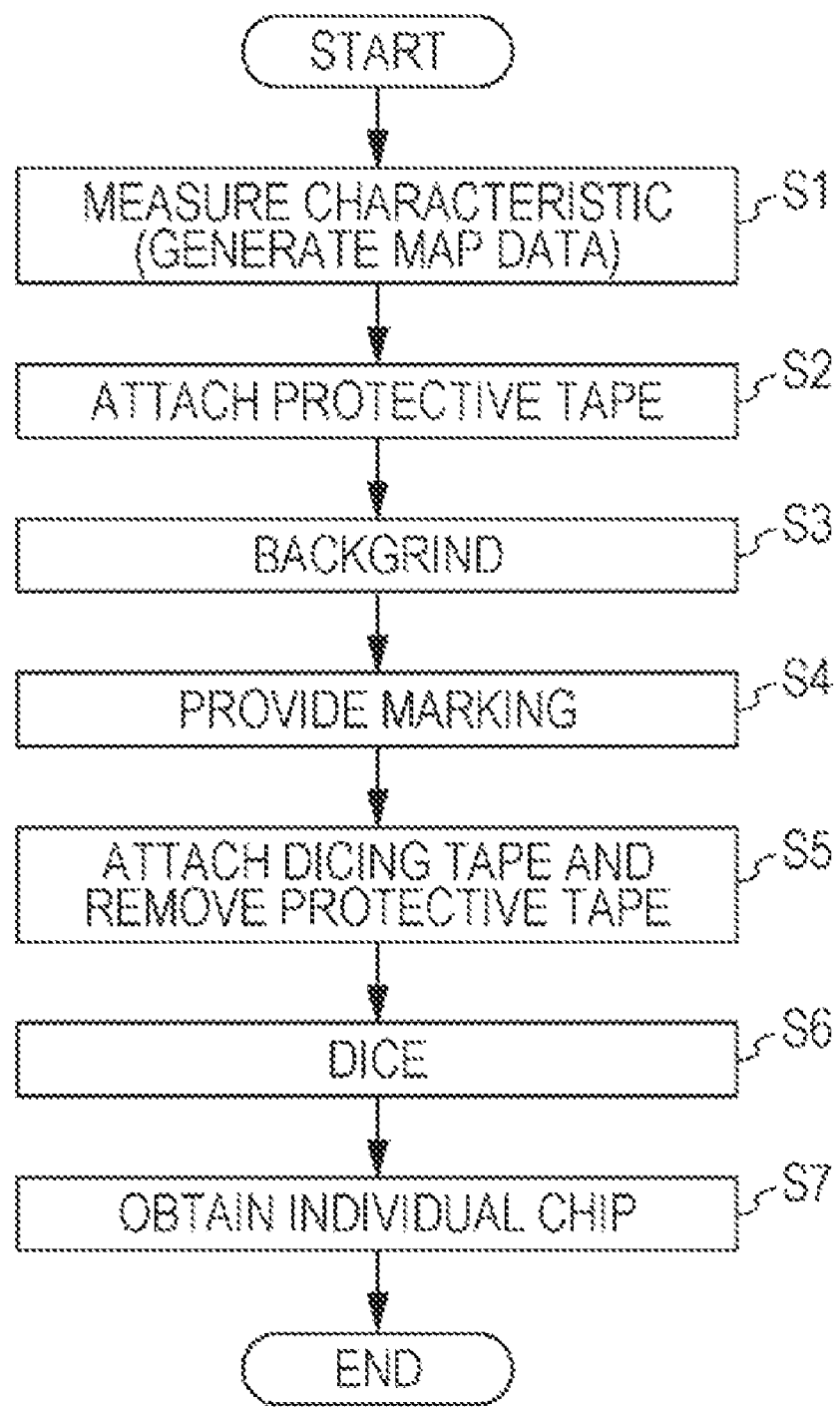
FIG. 1 is a process flow diagram from a characteristic measurement of semiconductor devices formed on a semiconductor substrate to the sorting out.

A process flow diagram of fabricating a semiconductor device is illustrated in FIG. 1.

FIGS. 2 to 14 each illustrate an exemplary process of fabrication of the semiconductor device along the flow diagram of FIG. 1.

The fabrication process includes: measuring characteristics of a plurality of semiconductor devices ("chips") formed on one of main surfaces of a semiconductor substrate; subjecting the semiconductor substrate to a dicing process; and then selectively sort out (i.e., pick out) the semiconductor devices.

First, a plurality of semiconductor devices 11 formed on one of main surfaces (i.e., a front surface) of a semiconductor substrate 10 are subject to a characteristic measurement (FIG. 1: step S1).

Figure 2:
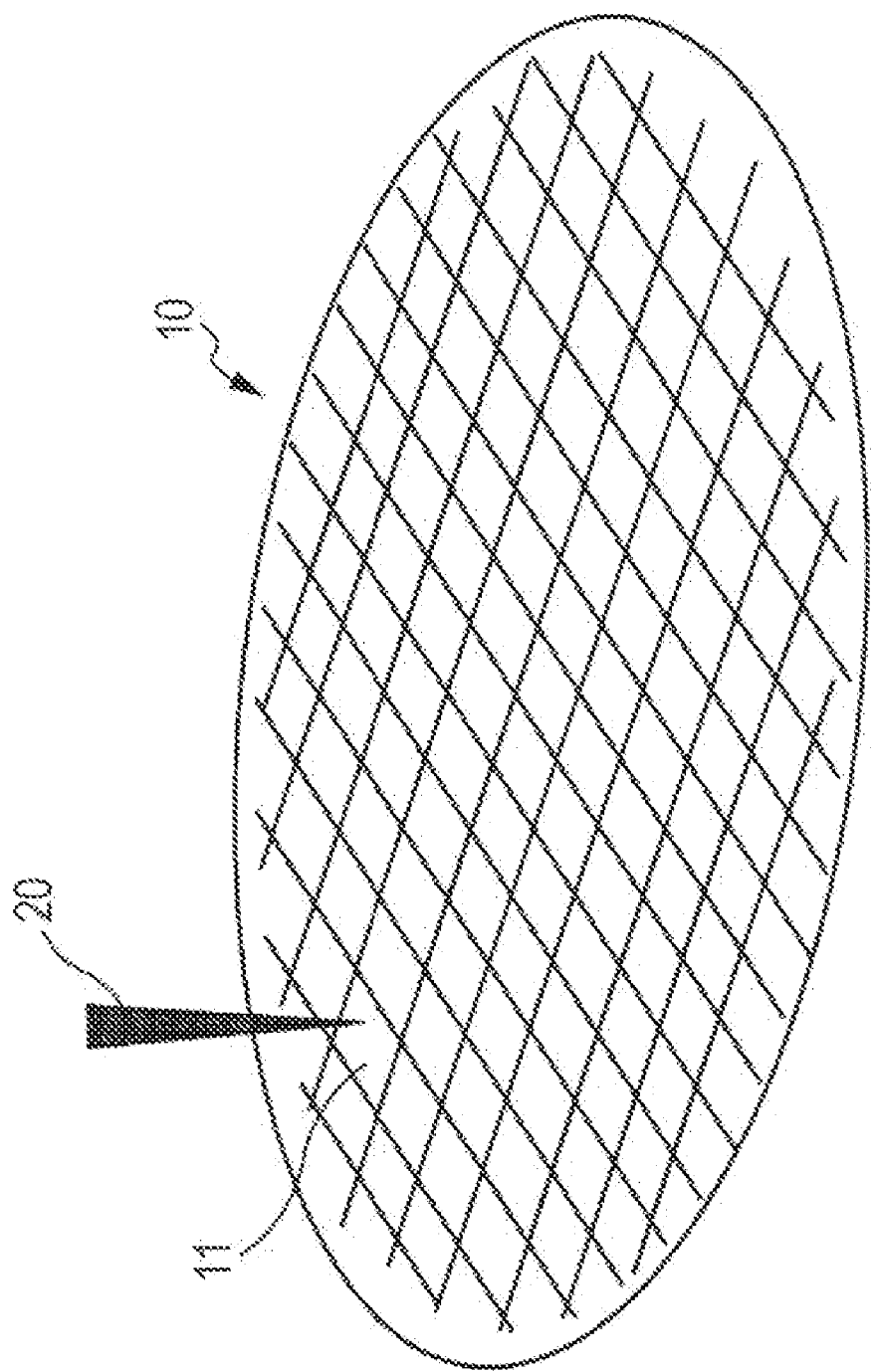
FIG. 2 is an exterior perspective view of an exemplary method for the characteristic measurement.

In the characteristic measurement, as illustrated in FIG. 2, a probe needle 20 of test equipment is brought into contact with an electrode terminal (not illustrated) of each semiconductor device 11 to apply a predetermined test signal.

Although a single probe needle 20 is illustrated in FIG. 2, two or more probe needles 20 are provided to correspond to electrode terminals of the semiconductor devices 11 to be tested.

It is determined through the characteristic measurement whether or not each semiconductor device 11 has a predetermined characteristic (i.e., non-defective or defective). Non-defective/defective data ("map data") for each semiconductor device 11 is then generated.

Figure 3:
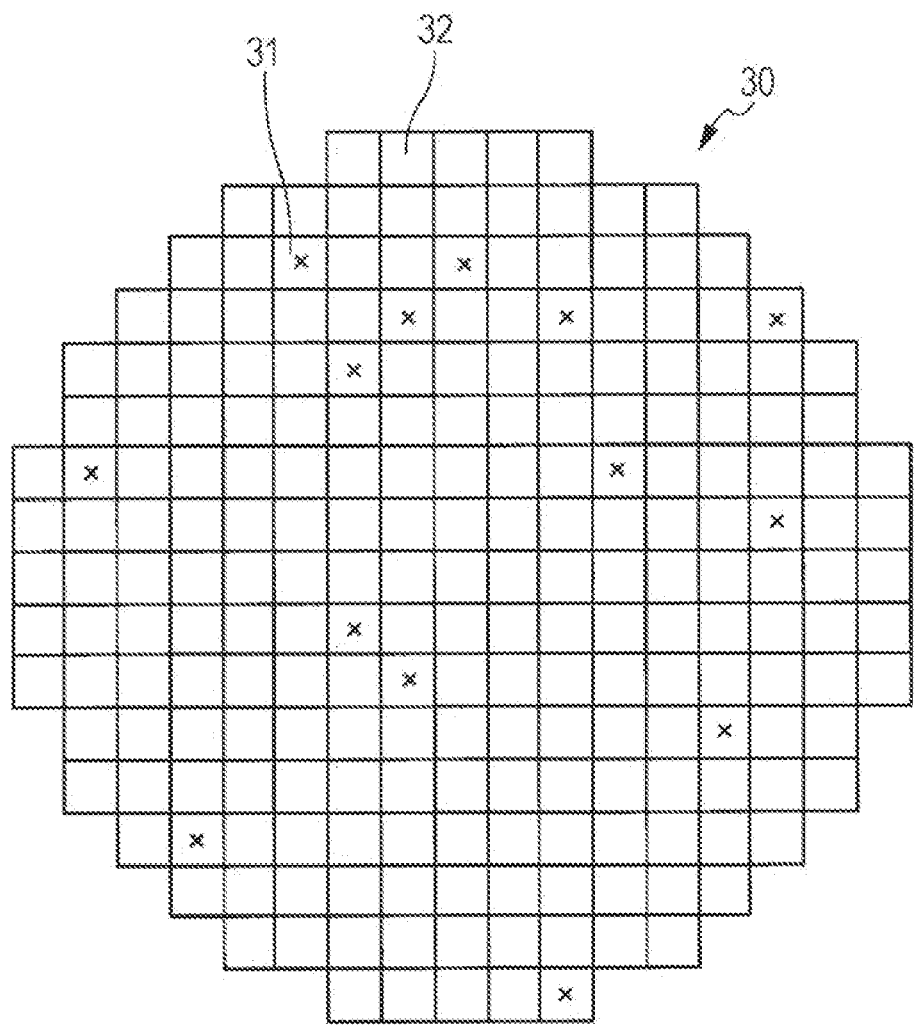
FIG. 3 illustrates exemplary map data.

FIG. 3 illustrates exemplary map data. For a plurality of semiconductor devices 11 formed on the semiconductor substrate 10, the map data 30 is generated corresponding to locations of the semiconductor devices 11 on the semiconductor substrate 10 to allow for recognition of non-defectiveness/defectiveness of the semiconductor devices 11.

The map data 30 of FIG. 3 is constituted by chip locations 31 with markings x and chip locations 32 with no marking. The chip locations 31 correspond to the semiconductor devices 11 determined to be defective while the chip locations 32 correspond to the semiconductor devices 11 determined to be non-defective.

Figure 4:
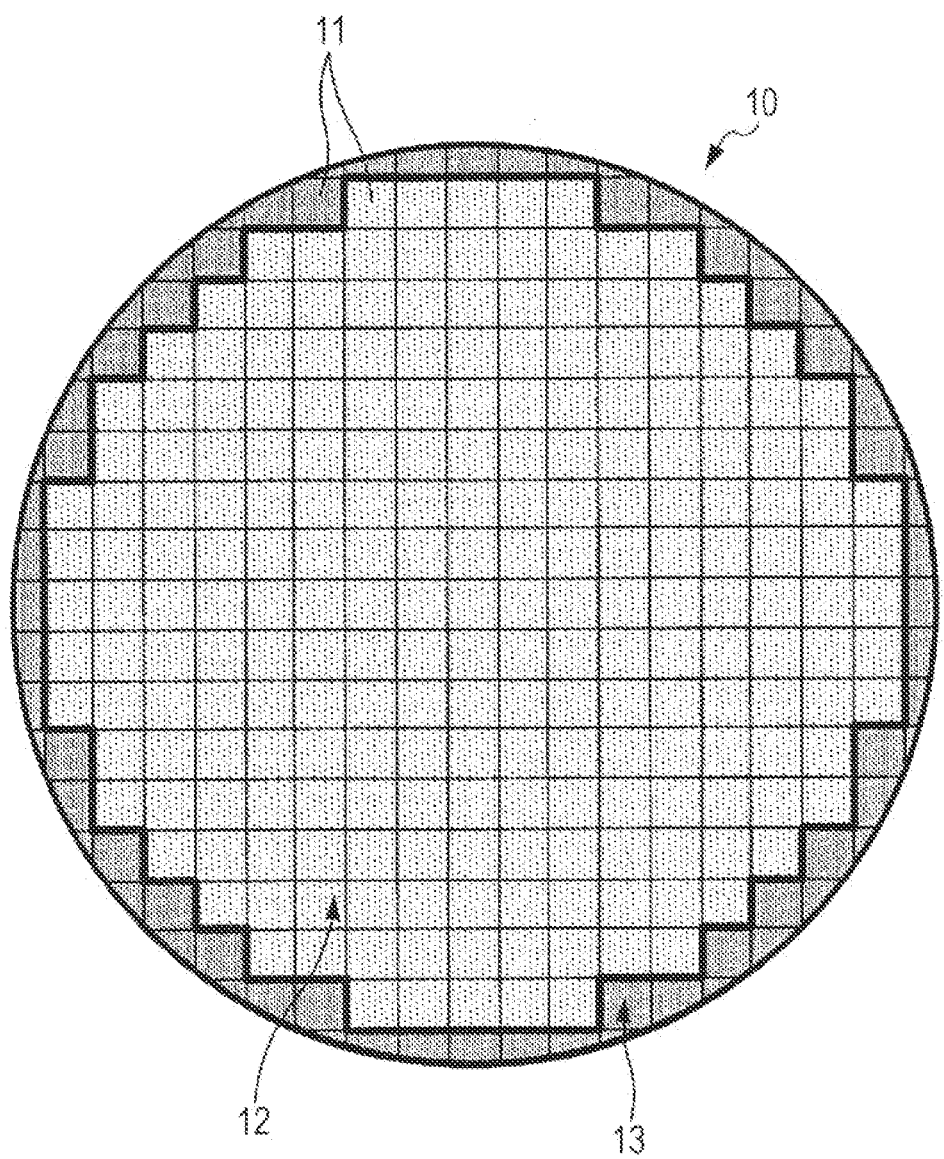
FIG. 4 is a schematic plan view of an exemplary semiconductor substrate on which a plurality of semiconductor devices are formed.

As illustrated in FIG. 4, the one of main surfaces of the semiconductor substrate 10 includes an effective chip area ("effective device area" or "first chip area") 12 and a peripheral area ("second chip area") 13. The peripheral area 13 is on an outer periphery of the effective chip area 12, i.e., on an edge of the semiconductor substrate 10.

The semiconductor devices 11 to be commercialized are formed in the effective chip area 12 and non-defective semiconductor devices 11 are obtained from among the semiconductor devices 11 in this area. Non-commercializable semiconductor devices 11 are formed in the peripheral area 13.

At the time of generating the map data 30, the semiconductor devices 11 formed in the effective chip area 12 are exclusively subject to the characteristic measurement among all the semiconductor devices 11 formed on the semiconductor substrate 10.

FIG. 3 illustrates the map data 30 generated for the semiconductor devices 11 within the effective chip area 12. Note that map data may include data of the semiconductor devices 11 formed outside the effective chip area 12, i.e., the semiconductor devices 11 formed in the peripheral area 13.

Figure 5:
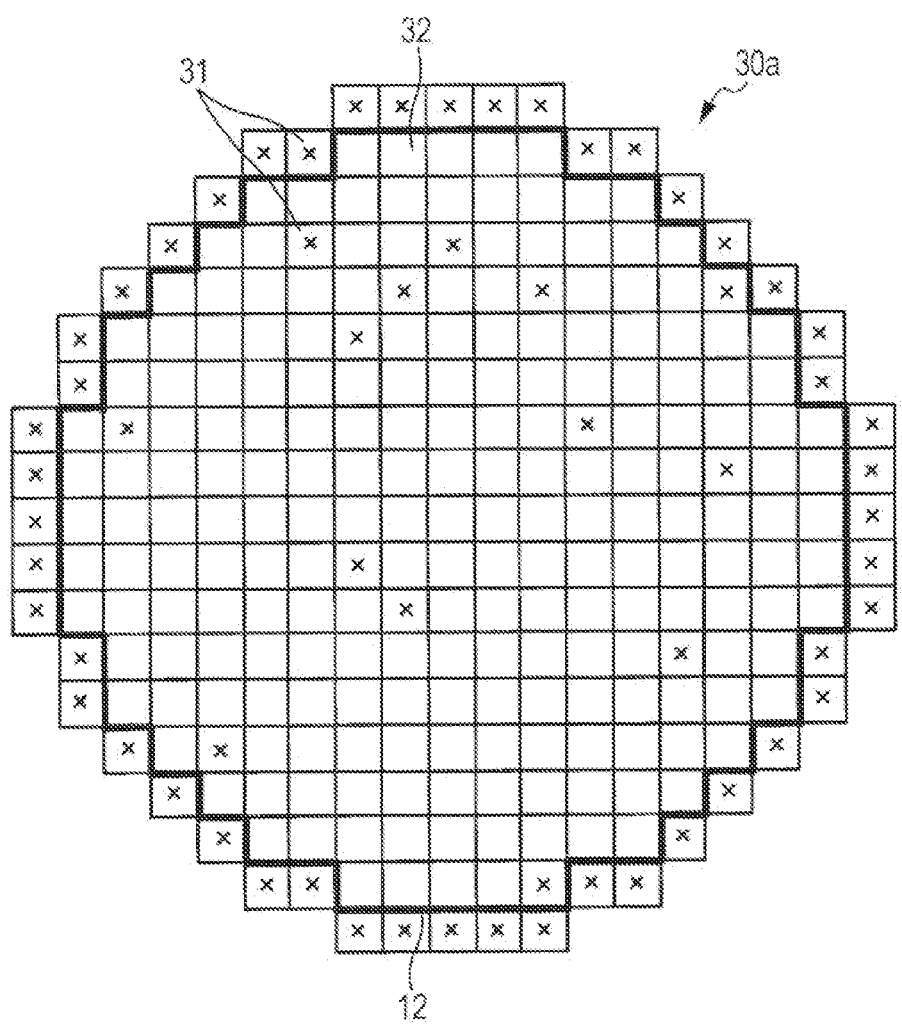
FIG. 5 illustrates other exemplary map data.

In this case, as illustrated in FIG. 5, the semiconductor devices 11 located outside the effective chip area 12 are treated as equivalent to the semiconductor devices 11 determined to be defective within the effective chip area 12. Generated map data 30a allows for discrimination between the semiconductor devices 11 outside the effective chip area 12 and the defective semiconductor devices 11.

The measurement of characteristics of the semiconductor devices 11 using the probe needles 20 and the generation of the map data 30 (or 30a) are performed by computer-based evaluation equipment.

In the evaluation equipment, each probe needle 20 is brought into contact with an electrode terminal of a targeted semiconductor device 11 to apply a predetermined electrical signal. An electrical signal detected from the semiconductor device 11 is stored in a storage device of the evaluation equipment.

When the detected electrical signal represents a predetermined value ("first value"), the evaluation equipment determines the semiconductor device 11 to be non-defective. When the detected electrical signal represents a value different from the first value ("second value"), the evaluation equipment determines the semiconductor device 11 to be defective.

The evaluation equipment executes the process sequentially for the plurality of semiconductor devices 11 formed in a grid pattern on the semiconductor substrate 10 and, on the basis of the determination result, generates the map data 30 (or 30a) corresponding to an arrangement of the semiconductor devices 11 on the semiconductor substrate 10.

In the map data 30 (or 30a), as an example, data "1" is assigned to the chip locations 31 corresponding to the semiconductor devices 11 determined to be defective whereas data "0" is assigned to the chip locations 32 corresponding to the semiconductor devices 11 determined to be non-defective formed on the semiconductor substrate 10.

The evaluation equipment determines non-defectiveness/defectiveness of the semiconductor devices 11 on the semiconductor substrate 10 with reference to the data of "0" or "1."

After the measurement of characteristics of the semiconductor devices 11 and the generation of the map data 30 (or 30a) representing the result of the measurement, a back surface of the semiconductor substrate 10 (i.e., a rear surface on which no semiconductor device is formed) is ground ("back grinding") as needed.

Figure 6:
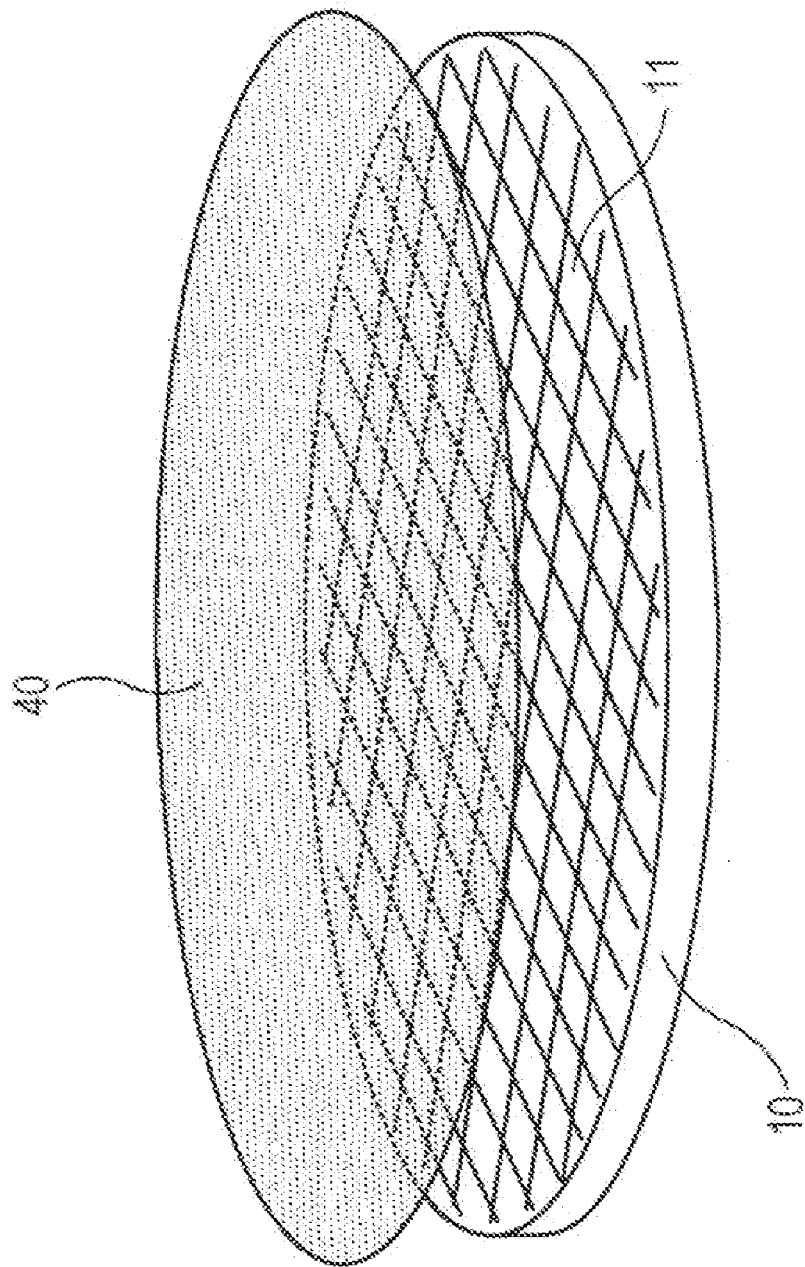
FIG. 6 is an exterior perspective view illustrating a process of attaching protective tape onto a surface of a semiconductor substrate.
Figure 7:
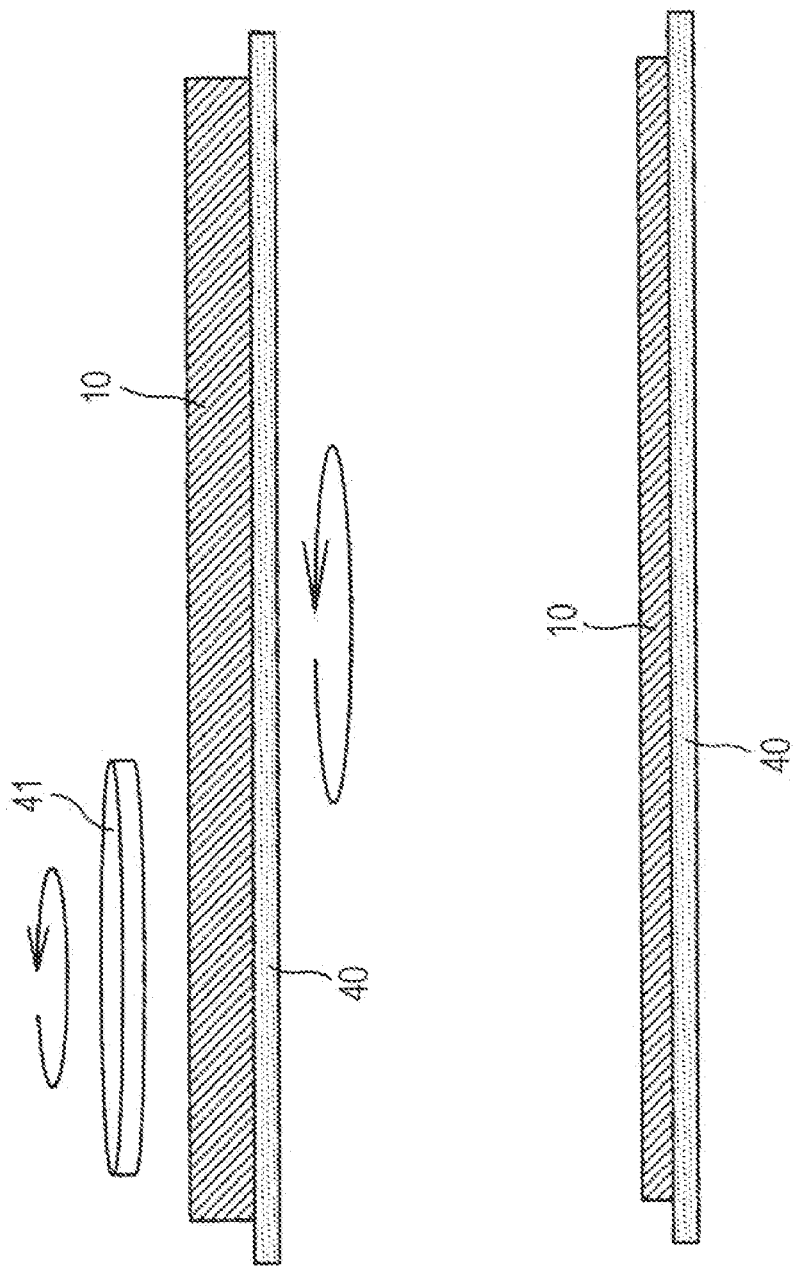
FIG. 7A illustrates a process of grinding a back surface of a semiconductor substrate and FIG. 7B is a sectional view illustrating a state in the semiconductor substrate reduced the thickness to a predetermined thickness.
Figure 8:
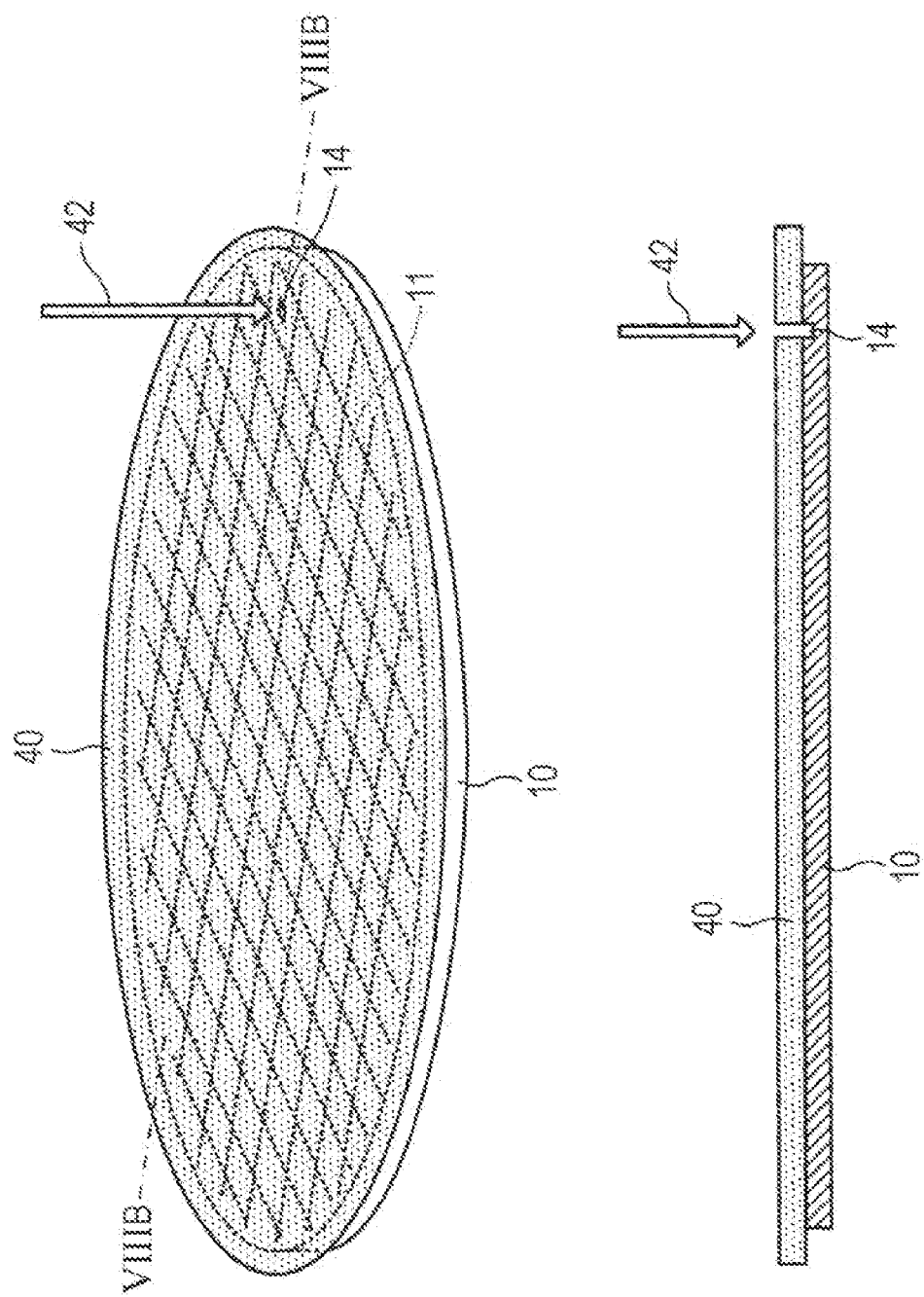
FIG. 8A is an exterior perspective view and FIG. 8B is a sectional view of a process of providing a marking on a surface of a semiconductor substrate.

As a pre-process of back grinding, a protective coat is formed on the front surface (i.e., the surface on which the semiconductor devices are formed) of the semiconductor substrate 10 as illustrated in FIG. 6.

The protective coat is formed by attaching protective tape 40 (FIG. 1: step S2). The protective tape 40 is transparent or translucent to allow, when attached to a surface of the semiconductor substrate 10, for recognition of locations of the semiconductor devices 11 formed on the semiconductor substrate 10 through the protective tape 40 by image recognition or visual inspection.

The protective tape 40 is made from, for example, a UV-curable tape material so as to meet the need that the protective tape 40 would be easily removed from the surface of the semiconductor substrate 10 in a subsequent process.

As illustrated in FIG. 7A, the back surface (i.e., the surface on which no semiconductor device is formed) of the semiconductor substrate 10 is ground with a grindstone 41 in back grinding equipment after the protective tape 40 is attached to the front surface of the semiconductor substrate 10 (FIG. 1: step S3).

During the back grinding, both the semiconductor substrate 10 and the grindstone 41 are rotated in certain direction(s) as illustrated in FIG. 7A to reduce the thickness of the semiconductor substrate 10 down to a predetermined thickness as illustrated in FIG. 7B.

The background semiconductor substrate 10 is placed on a predetermined stage with the surface on which the semiconductor devices are formed and to which the protective tape 40 is attached being exposed. The semiconductor devices 11 on the semiconductor substrate 10 are aligned through image recognition.

Subsequently, in accordance with the map data 30 (or 30a) obtained for the semiconductor substrate 10, the semiconductor devices 11 on the semiconductor substrate 10 are selectively irradiated with a laser beam and provided with markings (FIG. 1: step S4).

In particular, each of the selected semiconductor devices 11 is irradiated with a laser beam 42 via the protective tape 40 in accordance with the map data 30 (or 30a) and a marking 14 is provided as a depression on the surface of the semiconductor device 11 as illustrated in FIGS. 8A and 8B.

FIG. 8B is a sectional view taken along line VIIIB-VIIIB' of FIG. 8A. For example, the marking 14 is provided on a semiconductor device 11 located in the peripheral area 13 of the semiconductor substrate 10.

The marking 14 is used in a process of obtaining (i.e., picking out) semiconductor devices, which will be described later. Although the marking 14 is provided only at a single place on the semiconductor substrate 10 in FIGS. 8A and 8B, the markings 14 may be provided at two or more places on the semiconductor substrate 10.

That is, although the marking 14 is provided only at a single semiconductor device 11 within the peripheral area 13 of the semiconductor substrate 10 in FIGS. 8A and 8B, the markings 14 may be provided on the defective semiconductor devices 11 located outside the effective chip area 12 and/or within the effective chip area 12 among all the semiconductor devices 11 formed on the semiconductor substrate 10.

In the process of providing the markings 14, irradiation of the laser beam 42 may produce molten debris of the protective tape 40 and/or the semiconductor device 11 and cause the produced molten debris to scatter.

Figure 9:
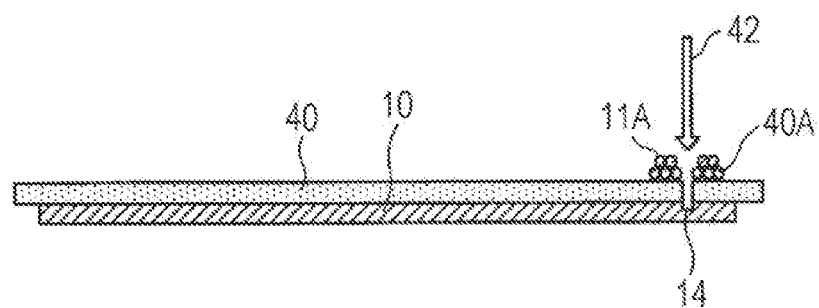
FIG. 9 is a sectional view of a process of providing a marking on a surface of a semiconductor substrate.

The scattered molten debris adheres to a surface of the protective tape 40 to produce a deposit 40A as illustrated in FIG. 9. As described later, the protective tape 40 is removed after dicing tape 43 is attached to the back surface of the semiconductor substrate 10. That is, any deposit 40A adhering to the surface of the protective tape 40 may be removed together with the protective tape 40.

The marking 14 may be provided through irradiation of the laser beam 42 while suppressing scattering of the molten debris in some methods. However, devices for implementing such methods are expensive and the control of the intensity of the laser beam 42 is sometimes not easy.

After predetermined semiconductor devices 11 are irradiated with the laser beam 42 via the protective tape 40 and provided with the markings 14, the semiconductor substrate 10 is subject to a dicing process to separate (i.e., individuate) the semiconductor devices 11.

Figure 10:
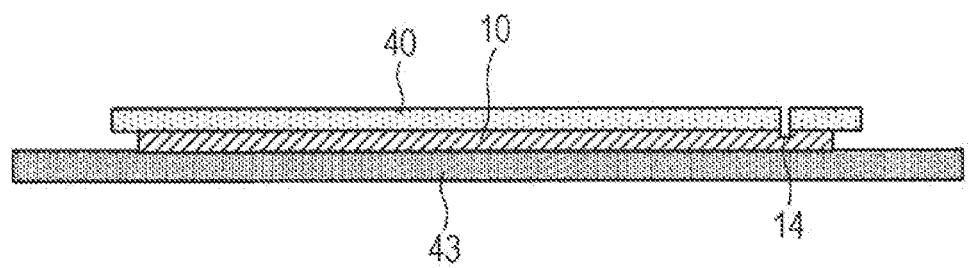
FIG. 10 is a sectional view illustrating a state in which dicing tape is attached to a back surface of the semiconductor substrate.

As illustrated in FIG. 10, the dicing tape 43 is attached to the back surface (a surface opposite to the surface to which the protective tape 40 is attached) of the semiconductor substrate 10 on which the markings 14 are selectively provided.

Figure 11:
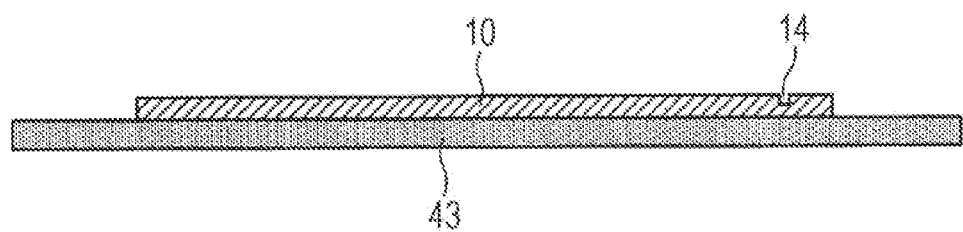
FIG. 11 is a sectional view illustrating a state in which the protective tape is removed from the surface of the semiconductor substrate.

The protective tape 40 is then removed as illustrated in FIG. 11 (FIG. 1: step S5). The protective tape 40 is removed as adhesiveness of the protective tape 40 is reduced through ultraviolet irradiation.

After the protective tape 40 is removed, the predetermined semiconductor devices 11 on the surface of semiconductor substrate 10 have the markings 14 provided thereon.

Since the semiconductor devices 11 are irradiated with the laser beam 42 via the protective tape 40 and provided with the markings 14, the markings 14 may be provided on the surfaces of the predetermined semiconductor devices 11 while preventing adhesion of the molten debris to the surface of the semiconductor substrate 10.

In this process, the protective tape 40 used for the back grinding of the semiconductor substrate 10 is used to prevent adhesion of the molten debris to the surface of the semiconductor substrate 10 when the markings 14 are provided.

Thus, in a fabrication process which includes back grinding, there is no need to prepare an additional film coating member for preventing adhesion of the molten debris to the surface of the semiconductor substrate 10.

In a fabrication process which excludes back grinding, a film material serving as the protective tape 40 is provided on the front surface (the surface on which the semiconductor devices are formed) of semiconductor substrate 10 before providing the markings 14, and then the surface is irradiated with the laser beam 42.

As described above, after the dicing tape 43 is attached to the back surface of the semiconductor substrate 10 and the protective tape 40 is removed, the semiconductor substrate 10 is subject to the dicing process to separate (i.e., individuate) the semiconductor devices 11 formed on the semiconductor substrate 10 (FIG. 1: step S6).

Figure 12A:
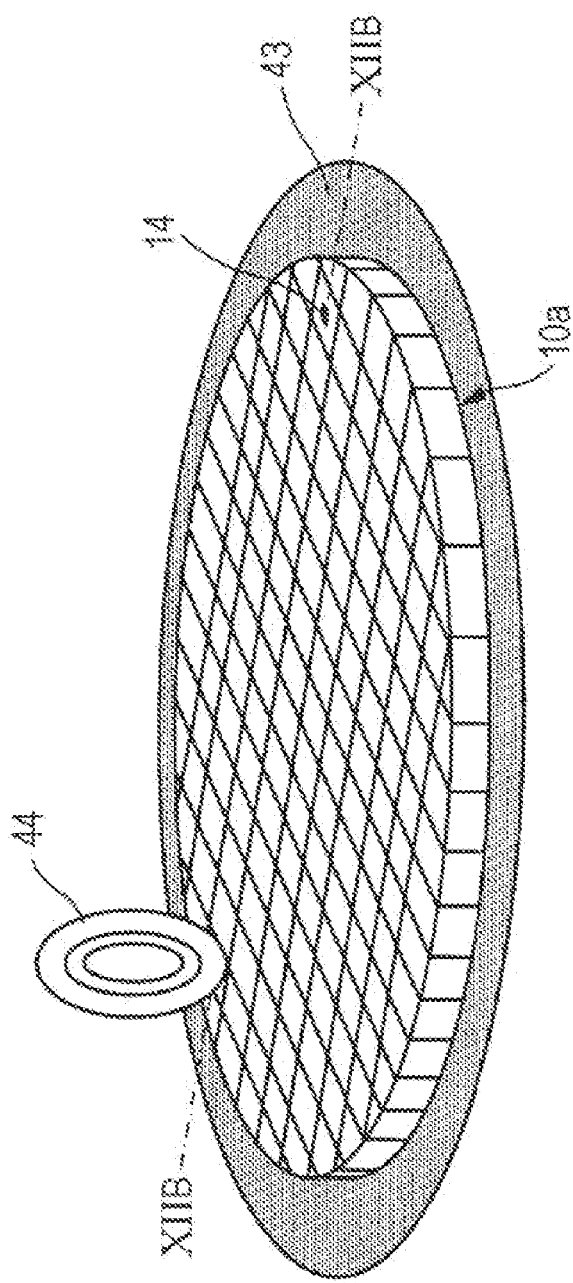
FIG. 12A is an exterior perspective view and FIG. 12B is a sectional view of a dicing process.
Figure 12B:
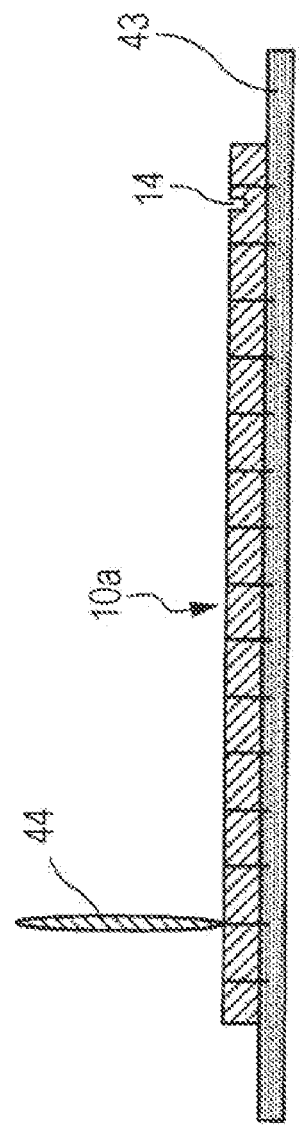

FIGS. 12A and 12B illustrate an exemplary dicing process. FIG. 12B is a sectional view taken along line XIIB-XIIB' of FIG. 12A.

In the dicing process, patterns formed on the surface of the semiconductor substrate 10 are recognized through image recognition and the semiconductor substrate 10 is cut into pieces using a dicing saw 44 along scribe regions provided between the plurality of semiconductor devices 11 arranged in a grid pattern.

The cutting depth of the dicing saw 44 is controlled to cut the semiconductor substrate 10 but not to cut the dicing tape 43. Thus, the semiconductor devices 11 are individuated while still adhering to the dicing tape 43.

Here, the diced individual semiconductor device 11 adhering to the dicing tape 43 is referred to as an individuated semiconductor substrate 10a.

The semiconductor substrate 10 before being subject to the dicing process is referred simply to a semiconductor substrate 10 or an unindividuated semiconductor substrate 10.

After the dicing process, the semiconductor devices 11 which are determined to be non-defective in the characteristic measurement are selectively sorted out (i.e., picked out) from the individuated semiconductor substrate 10a and are accommodated in, for example, a tray for conveying semiconductor devices or mounted on a mounting member, such as a wiring board or a lead frame (FIG. 1: step S7).

The picking-out process will be described with reference to FIGS. 13 and 14. The semiconductor devices 11 are picked out from the individuated semiconductor substrate 10a using, for example, a pick-out apparatus 50 illustrated for example in FIG. 13.

The pick-out apparatus 50 includes a camera 51, a display device 52, an absorption tool 53 and an ejector pin 54. The camera 51 is for photographing the individuated semiconductor substrates 10a placed on a base (stage, not illustrated). The display device 52 outputs images photographed with the camera 51. The absorption tool 53 absorbs the semiconductor devices 11. The ejector pin 54 ejects the semiconductor devices 11 upward.

The pick-out apparatus 50 further includes a storage device 55 which stores, for example, a computer program for implementing the picking-out process, data obtained during the picking-out process and data previously obtained about the unindividuated semiconductor substrate 10 and the individuated semiconductor substrate 10a.

The pick-out apparatus 50 further includes an alarm device 56 which informs an operator of abnormality during the process. A controller 50a controls the operation of the pick-out apparatus 50.

In the pick-out apparatus 50, the individuated semiconductor substrate 10a placed on a base (i.e., stage) may be moved in mutually orthogonal directions X and Y and rotated in a circumferential direction R. Amounts of movement in the directions X and Y and rotation to the circumferential direction R are controlled by the controller 50a using a coordinate system set for the pick-out apparatus 50.

In the pick-out apparatus 50, the semiconductor devices 11 to be picked out are photographed with the camera 51 and confirmed on the display device 52.

Since the camera 51 is fixed, an area of the individuated semiconductor substrate 10a to be displayed on the display device 52 is selected by moving and rotating the individuated semiconductor substrate 10a placed on the base (stage).

During a picking out event, the individuated semiconductor substrate 10a is moved in the directions X and Y so that a target semiconductor device 11 is located at a predetermined position on a screen, e.g., in a frame 52a at a center of the screen, of the display device 52.

The target semiconductor device 11 disposed at the predetermined position in the screen is ejected upward by the ejector pin 54 from the back surface of the dicing tape 43. The target semiconductor device 11 is then adsorbed and picked out (sorted out) by the absorption tool 53 which moves up and down as the ejection pin 54 operates.

The absorption tool 53 moves close to or away from the individuated semiconductor substrate 10a along direction E, picks out (i.e., sorted out) the target semiconductor device 11 and conveys the same along direction F.

The ejector pin 54 operates along direction G (upward and downward) to move close to or away from the back surface (the surface to which the dicing tape 43 is attached) of the individuated semiconductor substrate 10a in synchronization with the operation of the absorption tool 53.

As illustrated in FIG. 14, the ejector pin 54 includes tips 54a which are moved upward through and project from penetration holes 57a formed in a guide member 57 to eject the semiconductor device 11 upward from a lower surface of the dicing tape 43 and remove the same from the dicing tape 43.

After the ejecting operation, the ejector pin 54 moves downward into the guide member 57. Note that the semiconductor device 11 may be removed easily from the dicing tape 43 as adhesiveness of the dicing tape 43 is reduced through ultraviolet irradiation.

Figure 13:
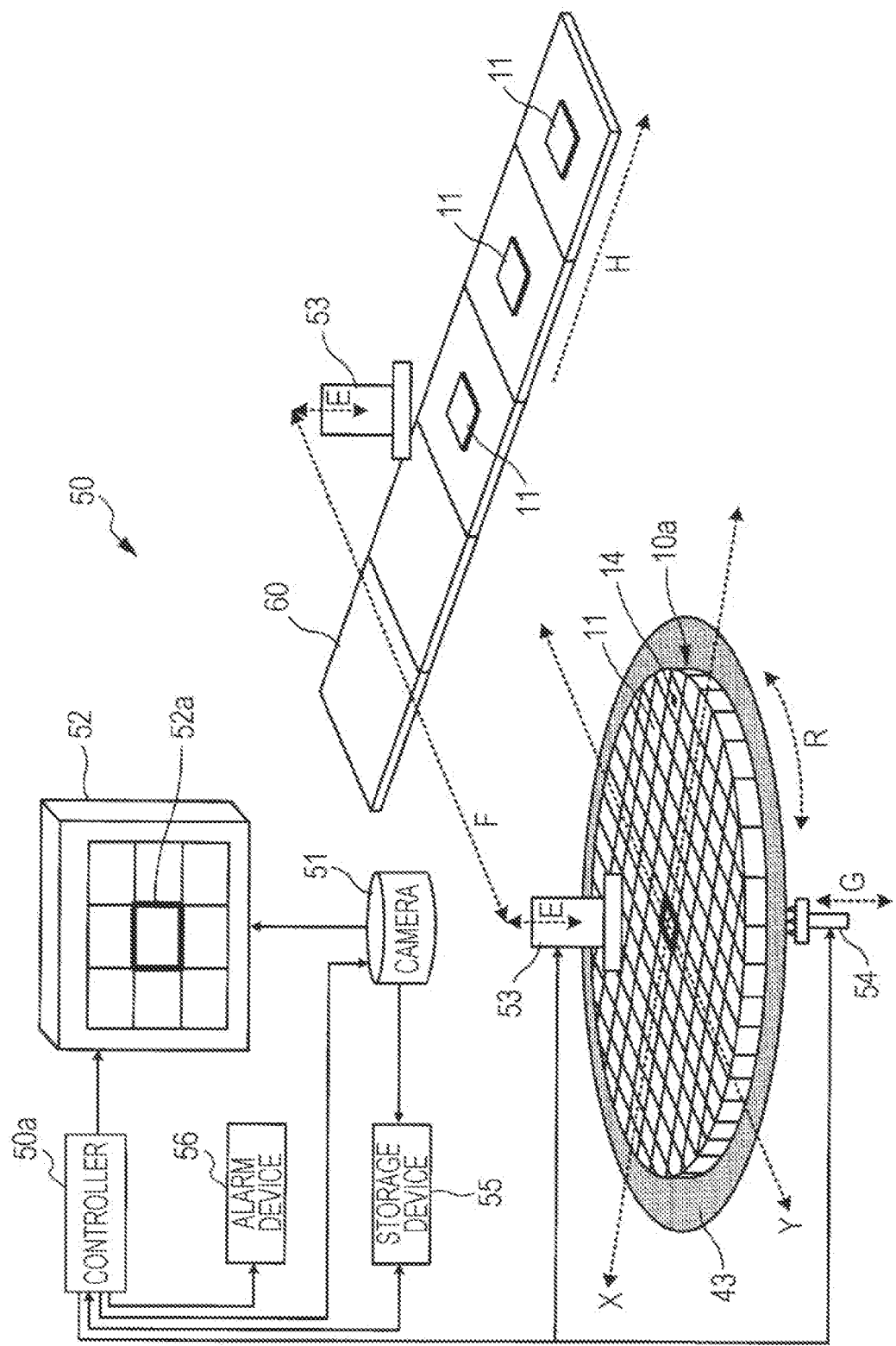
FIG. 13 illustrates a configuration of a pick-out apparatus and a picking-out process.

The semiconductor device 11 adsorbed and held by the absorption tool 53 is conveyed to, for example, a wiring board 60 by the absorption tool 53 as illustrated in FIG. 13.

The wiring board 60 is sized large enough to allow for mounting of a plurality of semiconductor devices 11. The semiconductor device 11 conveyed above the wiring board 60 is then mounted on a semiconductor device mounting section of the wiring board 60.

After the semiconductor device 11 is mounted on a predetermined position of the semiconductor device 11, the absorption tool 53 is returned to the individuated semiconductor substrate 10a side while the wiring board 60 is advanced in a predetermined direction H by one pitch.

Thus, the pick-out apparatus 50 is standing by for picking out the next semiconductor device 11. In this manner, the semiconductor devices 11 within the effective chip area 12 of the individuated semiconductor substrate 10a are sequentially picked out in accordance with the map data 30 (or 30a) beginning with a semiconductor device 11 of a predetermined position with reference to the locations of the semiconductor devices 11 determined to be non-defective.

The picking-out process utilizes the markings 14 provided on the individuated semiconductor substrate 10a whereas the following procedure is adopted in a process in which no marking 14 is provided.

Figure 15A:
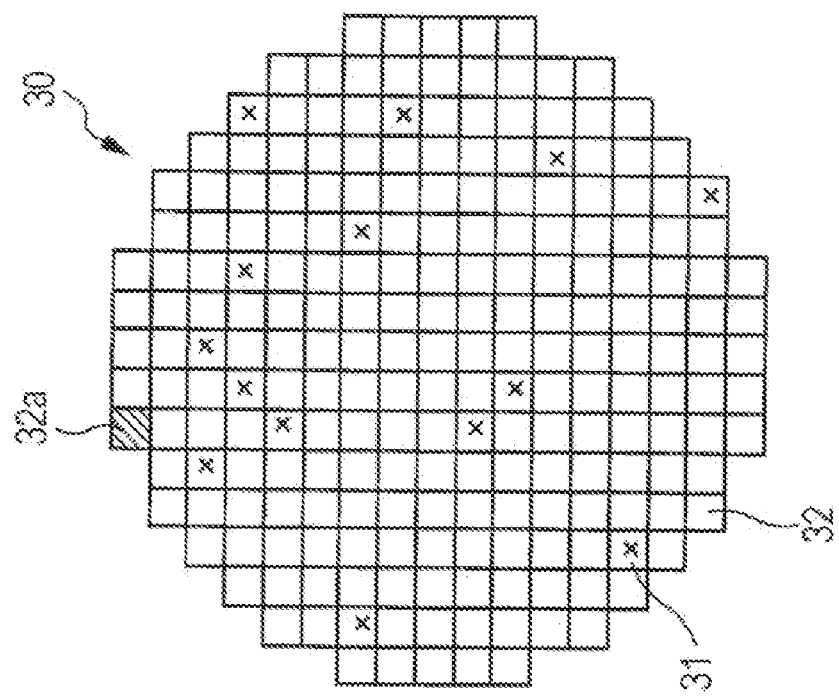
FIG. 15A illustrates an exemplary individuated semiconductor substrate and FIG. 15B illustrates exemplary map data.
Figure 15B:
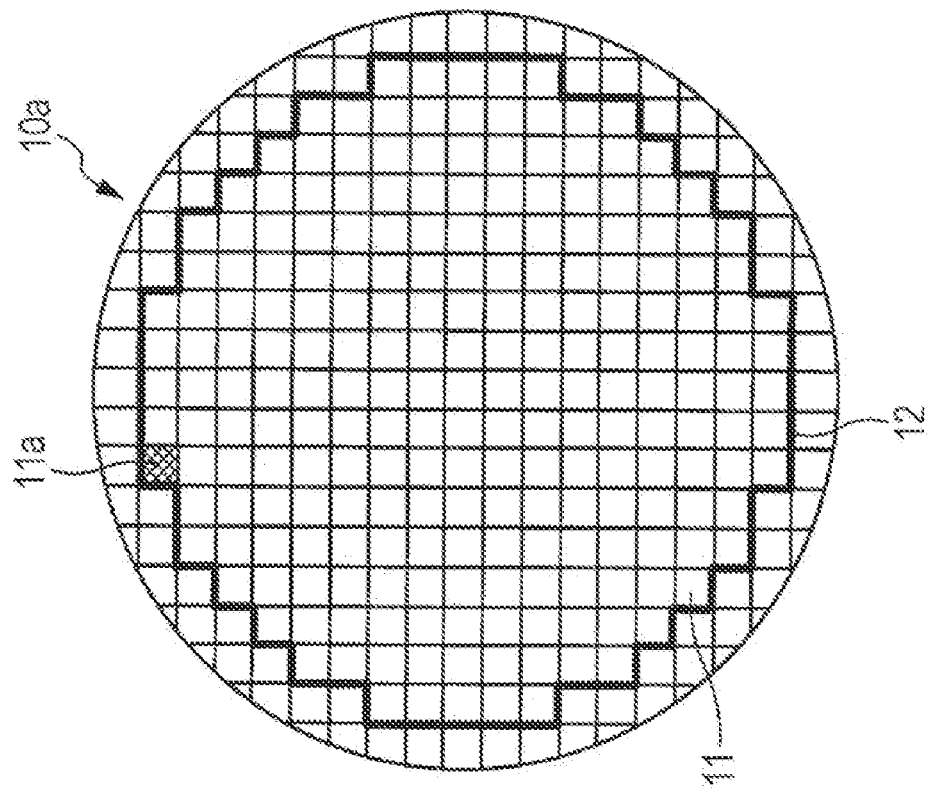

FIG. 15A illustrates an exemplary individuated semiconductor substrate 10a and FIG. 15B illustrates exemplary map data 30 obtained in association with the individuated semiconductor substrate 10a.

The semiconductor devices 11 determined to be non-defective are sequentially picked out beginning with, among other chip locations 32 determined to be non-defective on the map data 30, a semiconductor device 11a on the individuated semiconductor substrate 10a corresponding to the most upper left chip location 32a in FIG. 15A.

For convenience, the semiconductor device 11a with which the picking-out process is started is distinguished from other semiconductor devices 11 in the individuated semiconductor substrate 10a in FIG. 15A. However, information such as the marking used for distinguishing these semiconductor devices 11 is not included in the individuated semiconductor substrate 10a.

Figure 16:
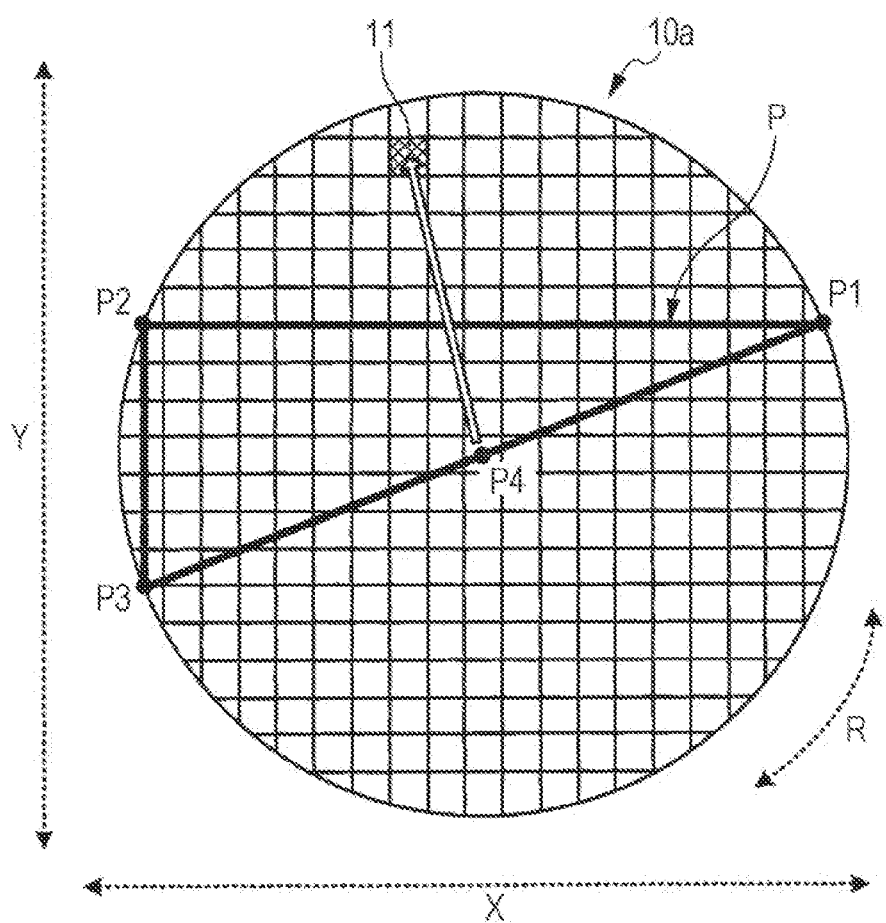
FIG. 16 illustrates a method for selecting a semiconductor device with which the picking-out process is started.
Figure 17:
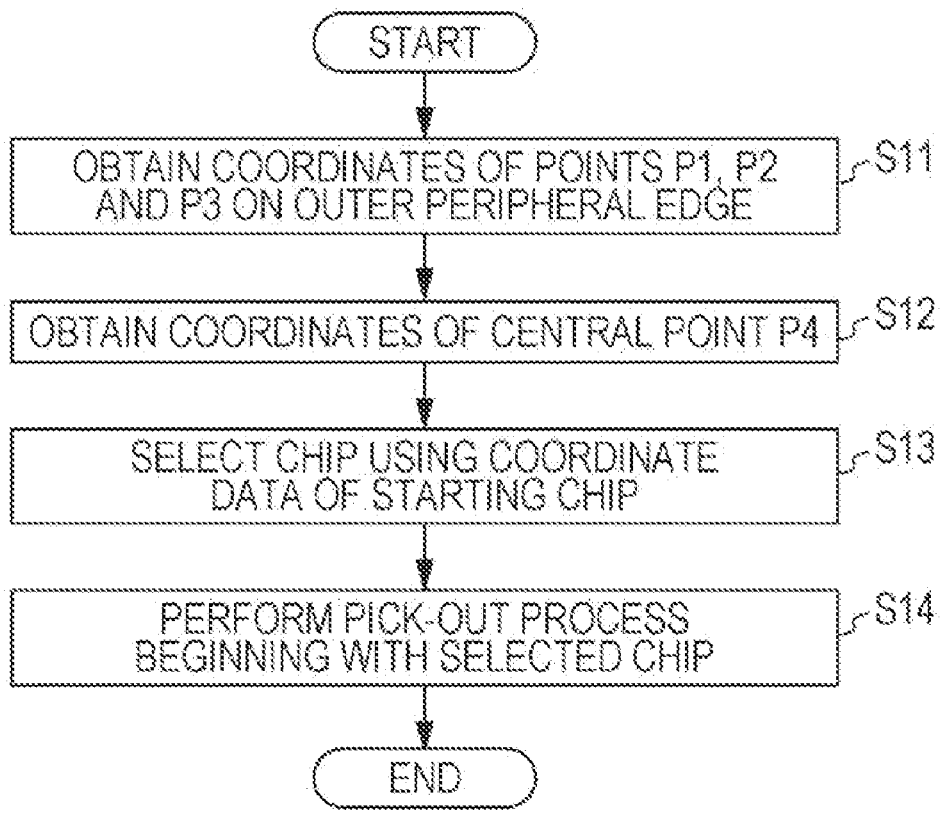
FIG. 17 is a process flow diagram of selecting a semiconductor device with which the picking-out process is started.

The semiconductor device with which the picking-out process is started ("starting chip" or "starting semiconductor device") 11a on the individuated semiconductor substrate 10a corresponding to the semiconductor device location ("starting chip location") 32a on the map data 30 is selected in a manner as illustrated for example in FIG. 16 and in a process flow diagram of FIG. 17.

At the time of execution of the process flow illustrated in FIGS. 16 and 17, the following axial and positional alignments are previously performed in the pick-out apparatus 50.

First, x and y directions of the camera 51, which is fixed, and the direction X and Y of the movement of the individuated semiconductor substrate 10a are aligned with each other, respectively.

The individuated semiconductor substrate 10a is rotated in the circumferential direction R so that the x and y directions of the xy coordinate system in each semiconductor device 11 on the unindividuated semiconductor substrate 10 and the directions X and Y of the movement of the individuated semiconductor substrate 10a are aligned with each other, respectively.

After the axial and positional alignments, the coordinates of points P1, P2 and P3 on an outer peripheral edge of the individuated semiconductor substrate 10a on the pick-out apparatus 50 are calculated by the pick-out apparatus 50 (FIG. 17: step S11).

The pick-out apparatus 50 first moves the individuated semiconductor substrate 10a in the X and Y directions and calculates the coordinates of the point P1 through image recognition with the camera 51.

Subsequently, the individuated semiconductor substrate 10a is moved only in the direction X, and the coordinates of the point P2 opposite to the point P1 along the direction X are calculated through image recognition with the camera 51.

Then, the individuated semiconductor substrate 10a is moved only in the direction Y, and the coordinates of the point P3 opposite to the point P2 along the direction Y are calculated through image recognition with the camera 51.

After the coordinates of the points P1, P2 and P3 are obtained, coordinates of a central point P4 of the individuated semiconductor substrate 10a are calculated from a right-angled triangle P which is inscribed in an outer periphery of the individuated semiconductor substrate 10a defined by the points P1, P2 and P3 (FIG. 17: step S12).

Coordinate data of the semiconductor device 11 which includes the starting chip 11a on the unindividuated semiconductor substrate 10 is previously stored in the pick-out apparatus 50. With the coordinate data, the pick-out apparatus 50 selects, as the starting point of the picking-out process, a semiconductor device 11 at a location corresponding to the coordinate data of the starting chip 11a with respect to the central point P4 (FIG. 17: step S13).

The pick-out apparatus 50 sequentially picks out the semiconductor devices 11 on the individuated semiconductor substrate 10a with the selected semiconductor device 11 as the starting point of the picking-out process (FIG. 17: step S14).

The pick-out apparatus 50 sequentially picks out, in accordance with the order of the chip locations 32 determined to be non-defective on the map data 30, predetermined semiconductor devices 11 on the individuated semiconductor substrate 10a corresponding to the chip locations 32 on the unindividuated semiconductor substrate 10 with reference to the coordinate data of the semiconductor device 11.

When the semiconductor device 11 as the starting point of the picking-out process is selected in the manner described above, however, it is possible that the actually selected semiconductor device 11 is not a starting chip 11a to be selected corresponding to the starting chip location 32a on the map data 30.

The reasons are as follows. For example, errors may sometimes be caused in the movement or rotation of the individuated semiconductor substrate 10a in the pick-out apparatus 50 for the calculation of the coordinates of the points P1, P2 and P3 in the axial or positional alignment process.

In this case, it is not possible to accurately calculate the coordinates of the central point P4 and there is an increasing possibility that a semiconductor device 11 other than the starting semiconductor device 11a would be selected in step S13.

There is also a possibility that certain gaps would be formed between the semiconductor devices 11 in the individuated semiconductor substrate 10a after the dicing process, since the semiconductor devices 11 are cut along the scribe regions provided between the semiconductor devices 11. Such a gap may sometimes cause a misalignment between the chip coordinates in the unindividuated semiconductor substrate 10 and the chip location on the individuated semiconductor substrate 10a.

Even if the semiconductor device 11 at the location corresponding to the coordinate data from the central point P4 is selected from the individuated semiconductor substrate 10a with reference to the coordinate data of the starting chip 11a of the unindividuated semiconductor substrate 10 in the pick-out apparatus 50, it is possible that the actually selected semiconductor device 11 is not the starting chip 11a to be selected.

When the semiconductor device 11 which is not the starting chip 11a to be selected is actually selected and the semiconductor devices 11 considered to be non-defective on the map data 30 are sequentially picked out with the selected semiconductor device 11 as the starting point of the picking-out process, a misalignment may be caused between the order of the chip locations 32 considered to be non-defective on the map data 30 and the order of the semiconductor devices 11 determined to be non-defective on the individuated semiconductor substrate 10a.

Thus, the picked out semiconductor devices 11 may include defective semiconductor devices 11. In order to avoid containment of the semiconductor devices 11 which are determined to be defective, it is visually confirmed that the selected semiconductor device 11 is actually the starting chip 11a corresponding to the starting chip location 32a on the map data 30 after the semiconductor device 11 as the starting point of the picking-out process is selected and before starting the picking-out process.

However, it is still possible that the starting chip 11a would be wrongly selected after such a visual confirmation. The possibility increases especially when a large number of semiconductor devices 11 are formed on a single semiconductor substrate 10 and no marking or the like is provided for the identification of a specific semiconductor device 11.

Containment of the semiconductor devices 11 determined to be defective into the picked out semiconductor devices 11 may sometimes be found out in a test process performed after the picked out semiconductor devices 11 are mounted on the wiring board 60. In such cases, the resultant loss of the non-defective semiconductor devices 11 may decrease yields and cause late delivery to customers.

Recently, the semiconductor devices 11 are becoming smaller in size while the semiconductor substrate 10 is becoming larger in diameter. As a result, the number of semiconductor devices 11 formed on a single semiconductor substrate 10 is increasing.

The number of scribe lines on the semiconductor substrate is also increasing, which may more easily cause a misalignment in the coordinates described above.

In order to select an accurate starting semiconductor device 11a and to avoid containment of defective semiconductor device 11 into subsequent processes in the individuated semiconductor substrate 10a utilizes the markings 14 provided on the selected semiconductor devices 11.

Hereinafter, embodiments of the invention related to selective sorting of the semiconductor devices formed on the semiconductor substrate using the marking(s) 14 will be described.

First Embodiment

In a first embodiment, a marking 14 is provided on a semiconductor device 11 located outside an effective chip area 12 on a semiconductor substrate and next to a starting semiconductor device 11a used as a starting point of the picking-out process.

FIG. 18A illustrates an exemplary individuated semiconductor substrate 10a and FIG. 18B illustrates exemplary map data 30 obtained in association with the individuated semiconductor substrate 10a according to the first embodiment.

In the first embodiment, the marking 14 is provided on a semiconductor device 11 ("chip with marking" or "semiconductor device with marking 11b") outside the effective chip area 12 located next to the starting semiconductor device 11a within the effective chip area 12 on the semiconductor substrate.

The semiconductor devices 11 within the effective chip area 12 are sequentially picked out from the starting semiconductor device 11a in the direction of a dotted arrow illustrated in FIG. 18A.

Figure 19:
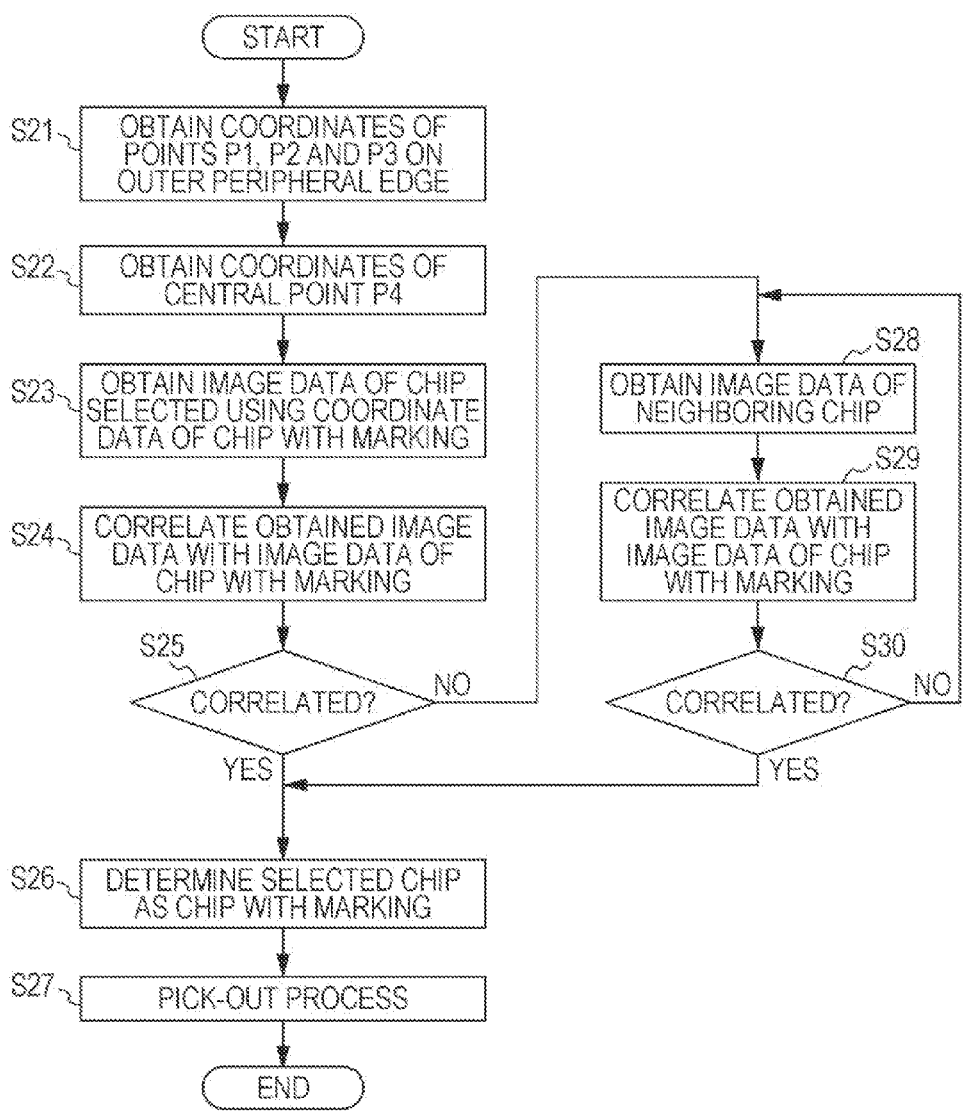
FIG. 19 is a process flow diagram of selecting a semiconductor device with which the picking-out process is started and picking out a semiconductor device to be sorted out according to the first embodiment.

With the semiconductor device with marking 11b being provided, the starting semiconductor device 11a for the picking-out process may be selected along for example a process flow diagram of FIG. 19.

First, an individuated semiconductor substrate 10a having the markings 14 provided thereon is placed in a pick-out apparatus 50 as described above.

After predetermined axial and positional alignments, the pick-out apparatus 50 calculates coordinates of points P1, P2 and P3 on an outer peripheral edge through image recognition with a camera 51 (FIG. 19: step S21).

Coordinates of a central point P4 are then calculated using the coordinates of the points P1, P2 and P3 (FIG. 19: step S22).

Coordinate data of the semiconductor device with marking 11b on the unindividuated semiconductor substrate 10 are previously stored in the pick-out apparatus 50.

The pick-out apparatus 50 first selects a semiconductor device 11 in a location corresponding to the coordinate data from the central point P4 and obtains image data of the selected semiconductor device 11 with the camera 51 (FIG. 19: step S23).

Image data of the semiconductor device with marking 11b of the individuated semiconductor substrate 10a are previously stored in the pick-out apparatus 50. The pick-out apparatus 50 correlates the image data obtained in step S23 with the previously-stored image data of the semiconductor device with marking 11b (FIG. 19: step S24) and determines whether or not the two sets of image data agree with each other (FIG. 19: step S25).

If the determination result in step S25 is affirmative, the pick-out apparatus 50 determines the semiconductor device 11 selected in step S23 as the semiconductor device with marking 11b (FIG. 19: step S26).

Thus, the pick-out apparatus 50 determines that the semiconductor device 11 next to the semiconductor device with marking 11b is a starting semiconductor device 11a.

Then, the pick-out apparatus 50 sequentially picks out, beginning with the starting semiconductor device 11a, the semiconductor devices 11 within the effective chip area 12 on the individuated semiconductor substrate 10a in accordance with the order of the chip locations 32 determined to be non-defective on the map data 30 (FIG. 19: step S27).

If, on the other hand, the determination result in step S25 is negative, the pick-out apparatus 50 performs a process below. The pick-out apparatus 50 does not determine the semiconductor device 11 selected in step S23 as the semiconductor device with marking 11b and obtains image data of a neighboring semiconductor device 11 (FIG. 19: step S28).

For example, the pick-out apparatus 50 moves the individuated semiconductor substrate 10a by a predetermined number of chips and obtains image data of a semiconductor device 11 captured with the camera 51 at that time.

The pick-out apparatus 50 correlates the obtained image data with the image data of previously-stored semiconductor device with marking 11b (FIG. 19: step S29) and determines whether or not the two sets of image data agree with each other (FIG. 19: step S30).

If the determination result in step S30 is affirmative, the process proceeds to step S26, where pick-out apparatus 50 determines the semiconductor device 11 of which image data is obtained in step S28 as the semiconductor device with marking 11b.

The process proceeds to step S27, where the pick-out apparatus 50 sequentially picks out the semiconductor devices 11 on the individuated semiconductor substrate 10a in a predetermined order from the starting semiconductor device 11a next to the semiconductor device with marking 11b.

If, on the other hand, the determination result in step S30 is negative, the process returns to step S28, where the pick-out apparatus 50 obtains image data of another neighboring semiconductor device 11 and performs the processes of step S29 and thereafter.

As described above, in the first embodiment, the pick-out apparatus 50 first selects the semiconductor device 11 considered to be the semiconductor device with marking 11b and correlates the image data of the selected semiconductor device 11 with the previously-stored image data of semiconductor device with marking 11b to determine whether or not the two sets of image data agree with each other.

These steps are repeated until image data in agreement with the image data of the semiconductor device with marking 11b is obtained. Once the image data in agreement with the image data of the semiconductor device with marking 11b is obtained, the pick-out apparatus 50 determines the semiconductor device 11 having the image data as the semiconductor device with marking 11b and defines a semiconductor device 11 next to the semiconductor device with marking 11b as the starting semiconductor device 11a with which the picking-out process is started.

With this process, the semiconductor device with marking 11b may be selected accurately and thereby the starting semiconductor device 11a next thereto may be selected accurately.

Accordingly, since the individuated semiconductor substrate 10a and the associated map data 30 may be correlated accurately, the non-defective semiconductor devices 11 may be picked out highly accurately and containment of the defective semiconductor devices 11 into subsequent processes may be avoided easily.

Since the semiconductor device with marking 11b is provided outside the effective chip area 12, no marking 14 is provided on the semiconductor device 11 which will be commercialized.

The individuated semiconductor substrate 10a and the associated map data 30 may be correlated accurately only by providing the semiconductor device with marking 11b at a single place outside the effective chip area 12. Thus, containment of defective semiconductor devices 11 into subsequent processes may be avoided in a simple and effective manner.

Although the semiconductor device with marking 11b is located next to the starting semiconductor device 11a, the position of the semiconductor device with marking 11b is not limited to the same.

The semiconductor device with marking 11b may also be located outside the effective chip area 12 one or more semiconductor devices 11 away in a longitudinal or transverse direction from the starting semiconductor device 11a. The semiconductor device with marking 11b may also be located outside the effective chip area 12 in an oblique direction of the starting semiconductor device 11a.

It suffices that the semiconductor device with marking 11b is located outside the effective chip area 12 in a predetermined positional relationship with the starting semiconductor device 11a which may accurately represent the location of the starting semiconductor device 11a.

Second Embodiment

In a second embodiment, a plurality of markings 14 are provided outside an effective chip area 12.

FIG. 20A illustrates an exemplary individuated semiconductor substrate 10a and FIG. 20B illustrates exemplary map data 30 obtained in association with the individuated semiconductor substrate 10a according to the second embodiment.

In the second embodiment, a marking 14 is provided on a semiconductor device 11 ("chip with marking" or "semiconductor device with marking 11b") outside the effective chip area 12 located next to the starting semiconductor device 11a within the effective chip area 12.

In addition, a plurality of (five in this embodiment) semiconductor devices with marking 11b are provided outside the effective chip area 12, each of which having a marking 14 provided thereon.

The semiconductor devices 11 within the effective chip area 12 are sequentially picked out from a starting semiconductor device 11a in the direction of a dotted arrow illustrated in FIG. 20A.

Figure 21:
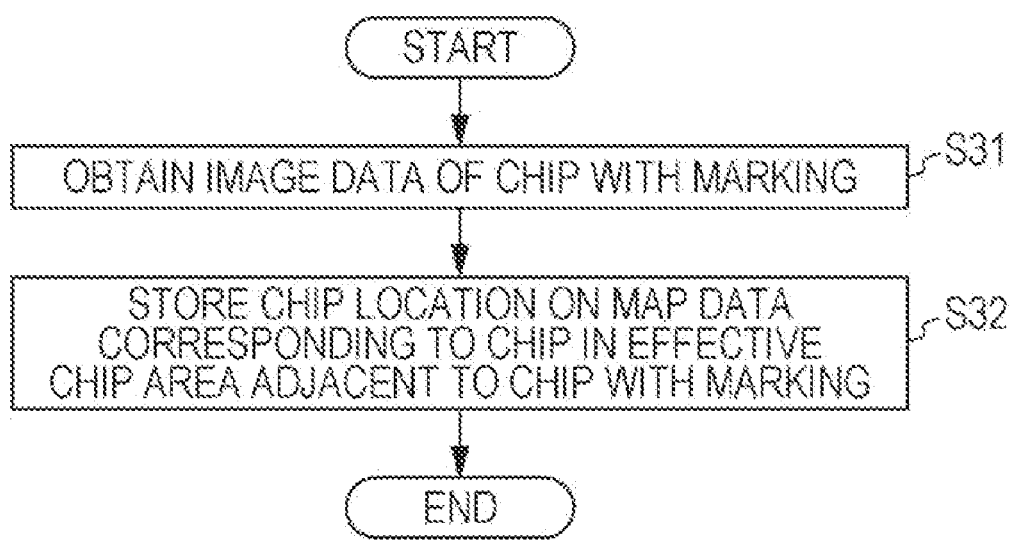
FIG. 21 is a first process flow diagram of picking out a semiconductor device according to the second embodiment.
Figure 22:
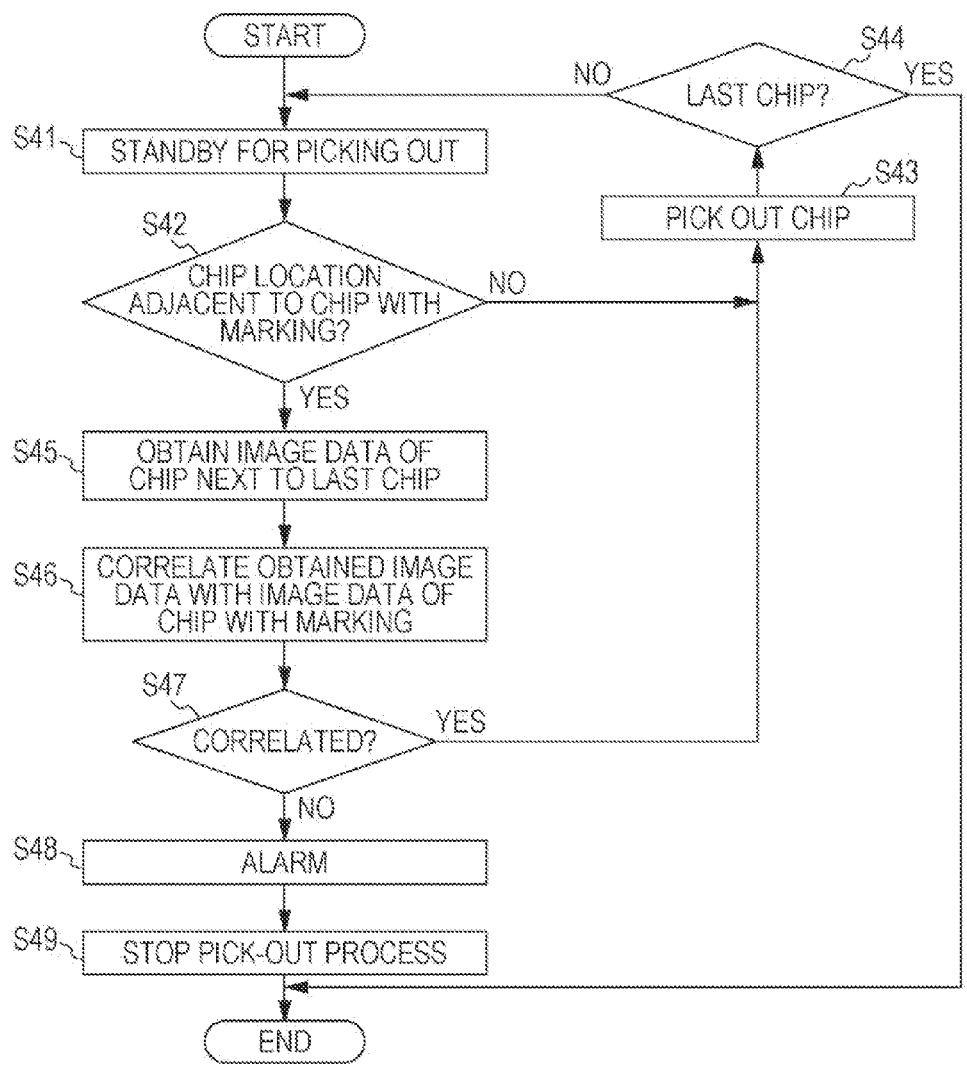
FIG. 22 is a second process flow diagram of picking out a semiconductor device according to the second embodiment.

A process flow of picking out using the semiconductor device with marking 11b is illustrated in flow diagrams of FIGS. 21 and 22. First, the markings 14 are provided on a plurality of semiconductor device regions outside and next to the effective chip area 12 of the unindividuated semiconductor substrate 10 to form the semiconductor devices with marking 11b.

Coordinate data of the plurality of the semiconductor devices with marking 11b are obtained before the picking-out process is started (FIG. 21: step S31).

The semiconductor device 11 within the effective chip area 12 located next to each semiconductor device with marking 11b is specified using the coordinate data and the chip locations 33 in the map data 30 in corresponding to the specified semiconductor device 11 are stored (FIG. 21: step S32).

Then, as in the first embodiment, the starting semiconductor device 11a with which the picking-out process of the semiconductor devices 11 is started is determined along the process flow diagram of FIG. 19.

The pick-out apparatus 50 performs the picking-out process along the process flow diagram of FIG. 22.

First, the pick-out apparatus 50 is standing by for picking out the semiconductor devices 11 on the individuated semiconductor substrate 10a in accordance with the order of the chip locations 32 considered to be non-defective on the map data 30 (FIG. 22: step S41).

Then, the pick-out apparatus 50 determines whether or not the semiconductor device 11 to be picked out corresponds to the chip location 33 on the map data 30 stored in step S32 (FIG. 22: step S42).

That is, the pick-out apparatus 50 determines whether or not the semiconductor device 11 to be picked out is the semiconductor device 11 within the effective chip area 12 located next to the semiconductor device with marking 11b outside the effective chip area 12.

If the determination result in step S42 is negative, the pick-out apparatus 50 picks out the semiconductor device 11 which is currently picked out (FIG. 22: step S43).

The pick-out apparatus 50 then determines whether or not the semiconductor device 11 which is currently picked out is the last semiconductor device 11 to be picked out from the individuated semiconductor substrate 10a (FIG. 22: step S44).

If the determination result in step S44 is affirmative, the picking-out process is completed. If, on the other hand, the determination result in step S44 is negative, the process proceeds to step S41, where the pick-out apparatus 50 is standing by for picking out the next semiconductor device 11.

If the determination result in step S42 is affirmative, the pick-out apparatus 50 obtains image data of a semiconductor device 11 next to the semiconductor device 11 which is currently picked out (along the picking out direction) (FIG. 22: step S45).

The pick-out apparatus 50 correlates the image data obtained in step S45 with the previously-stored image data of the semiconductor device with marking 11b (FIG. 22: step S46) and determines whether or not the two sets of image data agree with each other (FIG. 22: step S47).

If the determination result in step S47 is affirmative, the process proceeds to step S43, where the pick-out apparatus 50 picks out semiconductor devices 11 which are waiting for the picking-out process and the process proceeds to step S44 and thereafter.

If, on the other hand, the determination result in step S47 is negative, the pick-out apparatus 50 performs a process below.

In this case, the individuated semiconductor substrate 10a and the associated map data 30 are not in correspondence and it is possible that defective semiconductor device(s) 11 might be contained in the semiconductor devices 11 which were picked out already.

Thus, the pick-out apparatus 50 outputs an alarm to inform an operator of abnormality (FIG. 22: step S48) and stops the picking-out process (FIG. 22: step S49).

When the picking-out process is stopped, the operator confirms correlation between the individuated semiconductor substrate 10a and the map data 30 by image recognition or visual inspection and establishes a new correlation. The operator also confirms the number of defective semiconductor devices 11 in the semiconductor devices 11 which are already picked out before the picking-out process is stopped.

As described above, in the second embodiment, a plurality of semiconductor devices with marking 11b are provided at a plurality of places outside the effective chip area 12 in addition to the semiconductor device with marking 11b used for determination of the starting semiconductor device 11a.

The starting semiconductor device 11a is determined using these semiconductor devices with marking 11b and the correlation between the individuated semiconductor substrate 10a and the associated map data 30 is examined during the picking-out process.

With such a process flow, it is possible to accurately correlate the individuated semiconductor substrate 10a with the associated map data 30 during the picking-out process and more effectively avoid containment of defectives into the subsequent processes.

Although the semiconductor devices with marking 11b are disposed adjacent to the effective chip area 12, locations of the semiconductor devices with marking 11b are not limited to the same. It suffices that the semiconductor devices with marking 11b are in a predetermined positional relationship with the effective chip area 12.

Although a plurality of semiconductor devices with marking 11b are provided at a plurality of places outside the effective chip area 12 in addition to the semiconductor device with marking 11b used for determination of the starting semiconductor device 11a, the number of the semiconductor device with marking 11b is not limited to the same.

A similar effect may be obtained by providing a semiconductor device with marking 11b at least a place outside the effective chip area 12 in addition to the semiconductor device with marking 11b used for determination of the starting semiconductor device 11a.

The semiconductor devices with marking 11b may be arranged to surround the effective chip area 12 to provide a similar effect.

Figure 23:
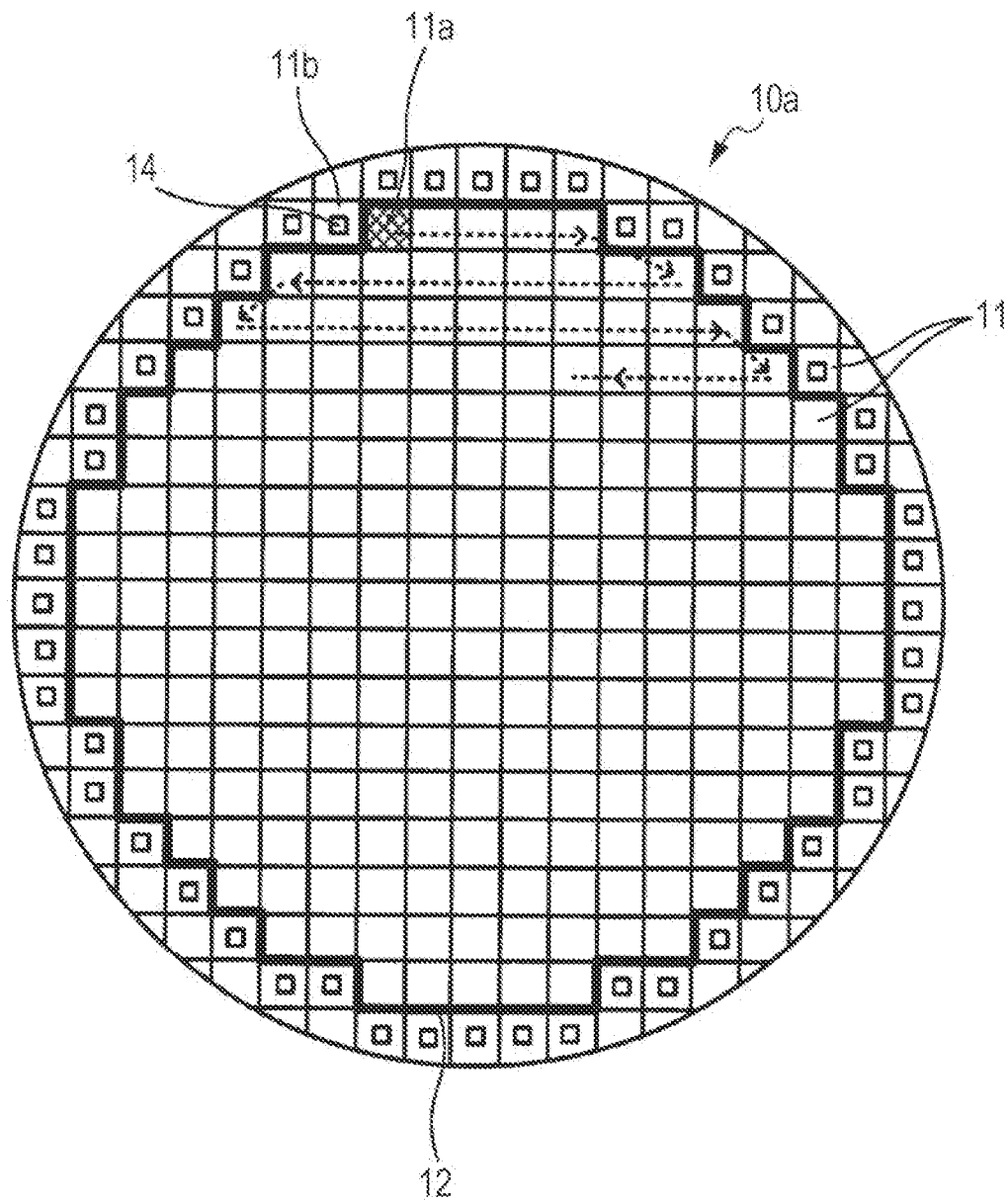
FIG. 23 illustrates another exemplary process of picking out a semiconductor device according to the second embodiment.
Figure 24:
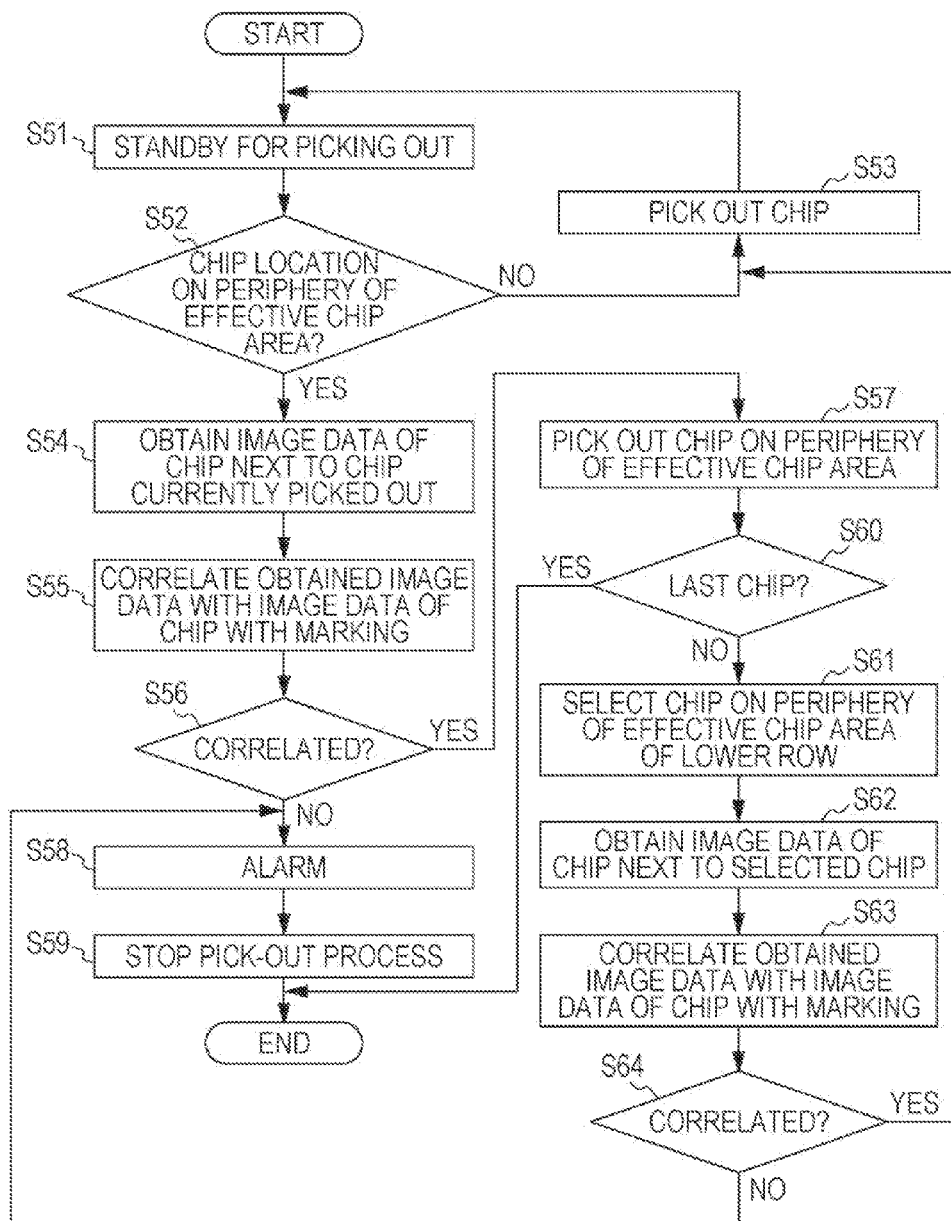
FIG. 24 is another exemplary process flow diagram of picking out a semiconductor device according to the second embodiment.

In the second embodiment, an arrangement of the semiconductor devices on a semiconductor substrate illustrated in FIG. 23 and a process flow diagram illustrated in FIG. 24 may also be employed.

That is, in the second embodiment, a plurality of semiconductor devices with marking 11b are disposed adjacent to and surrounding the effective chip area 12. This state is illustrated in FIG. 23.

The picking-out process is performed along the process flow diagram of FIG. 24 with a plurality of semiconductor devices with marking 11b disposed to surround the effective chip area 12.

The starting semiconductor device 11a is first determined along the process flow diagram of FIG. 19 as in the first embodiment, and the semiconductor devices 11 within the effective chip area 12 are sequentially picked out beginning with the starting semiconductor device 11a along a dotted arrow illustrated in FIG. 23.

The pick-out apparatus 50 is first standing by for picking out the semiconductor devices 11 on the individuated semiconductor substrate 10a in accordance with the order of the chip locations 32 considered to be non-defective on the map data 30 (FIG. 24: step S51).

The pick-out apparatus 50 then determines whether or not the semiconductor device 11 to be picked out corresponds to a chip location on a periphery of the effective chip area 12 (map data 30) on the map data 30 (FIG. 24: step S52).

If the determination result in step S52 is negative, the pick-out apparatus 50 picks out the semiconductor device 11 which is currently picked out (FIG. 24: step S53).

The process then returns to step S51, where the pick-out apparatus 50 is standing by for picking out the next semiconductor device 11.

If, on the other hand, the determination result in step S52 is affirmative, the pick-out apparatus 50 obtains image data of a semiconductor device 11 next to the semiconductor device 11 which is currently picked out (along the picking out direction) (FIG. 24: step S54).

The pick-out apparatus 50 correlates the image data obtained in step S54 with the previously-stored image data of the semiconductor device with marking 11b (FIG. 24: step S55) and determines whether or not the two sets of image data agree with each other (FIG. 24: step S56).

If the determination result in step S56 is affirmative, the pick-out apparatus 50 picks out semiconductor devices 11 on the periphery of the effective chip area 12 which are waiting for the picking-out process (FIG. 24: step S57).

If, on the other hand, the determination result in step S56 is negative, the pick-out apparatus 50 outputs an alarm to inform the operator of abnormality (FIG. 24: step S58) and stops the picking-out process (FIG. 24: step S59).

The pick-out apparatus 50 determines whether or not the semiconductor device 11 which is currently picked out is the last semiconductor device 11 to be picked out from the individuated semiconductor substrate 10a (FIG. 24: step S60).

If the determination result in step S60 is affirmative, the picking-out process is completed. If, on the other hand, the determination result in step S60 is negative, the pick-out apparatus 50 performs the process below.

The pick-out apparatus 50 first selects a semiconductor device 11 corresponding to a chip location on a lower row on the periphery of the effective chip area 12 near the semiconductor device 11 which is currently picked out (FIG. 24: step S61).

The pick-out apparatus 50 then obtains image data of a semiconductor device 11 next to the semiconductor device 11 which is currently picked out (along a direction opposite to the picking-out direction of the lower row) (FIG. 24: step S62).

The pick-out apparatus 50 correlates the image data obtained in step S62 with the previously-stored image data of the chip with marking 11b (FIG. 24: step S63) and determines whether or not the two sets of image data agree with each other (FIG. 24: step S64).

If the determination result in step S64 is affirmative, the process proceeds to step S53, where the pick-out apparatus 50 picks out the semiconductor device 11 on the lower row on the periphery of the effective chip area 12 which has been selected in step S61, and performs the processes of step S51 and thereafter.

If, on the other hand, the determination result in step S64 is negative, the process proceeds to step S58, where the pick-out apparatus 50 outputs an alarm and stops the picking-out process in step S59.

It is also possible with such a process flow to accurately correlate the individuated semiconductor substrate 10a with the associated map data 30 during the picking-out process.

A process of confirming that the semiconductor device 11 to be picked out is not the semiconductor device with marking 11b may be added between step S52 and S53 of the process flow diagram of FIG. 24. A process flow diagram in that case is illustrated in FIG. 25.

Figure 25:
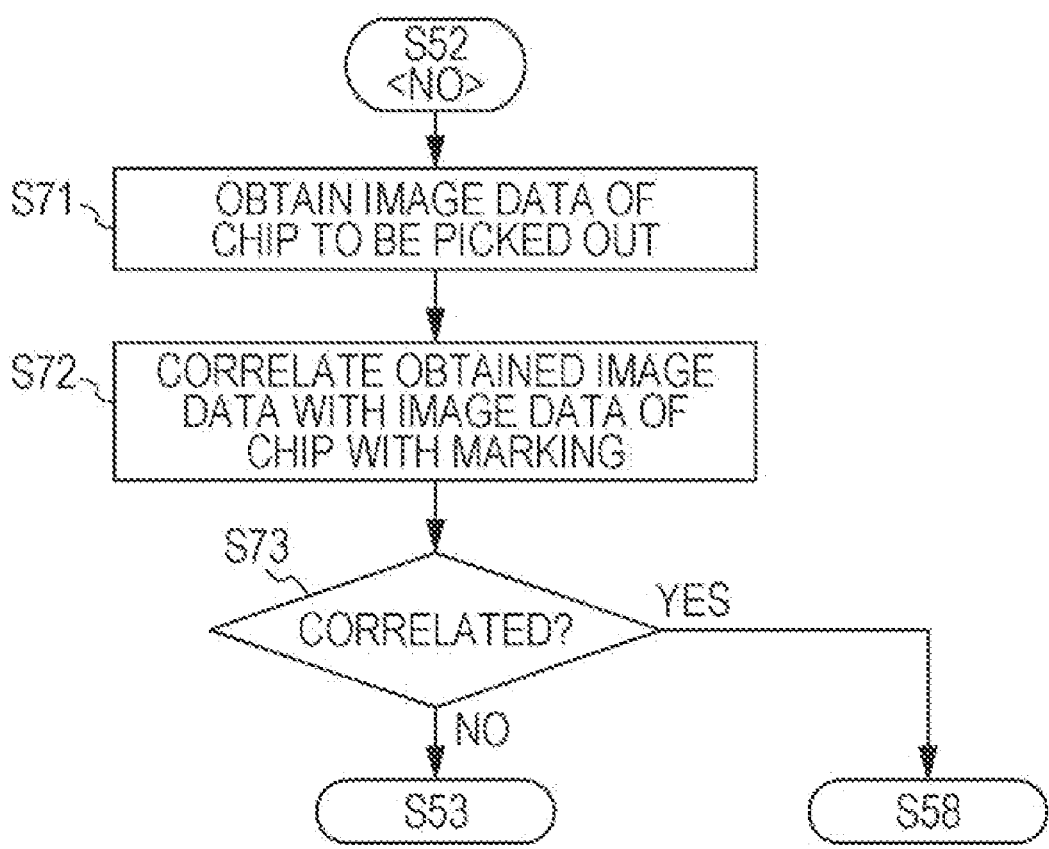
FIG. 25 is an additional process flow diagram of picking out a semiconductor device in the second embodiment.

First, when it is determined that the semiconductor device 11 to be picked out does not correspond to a chip location on the periphery of the effective chip area 12 on the map data 30 in step S52, the pick-out apparatus 50 obtains image data of that semiconductor device 11 (FIG. 25: step S71).

The pick-out apparatus 50 correlates the image data obtained in step S71 with the previously-stored image data of the semiconductor device with marking 11b (FIG. 25: step S72) and determines whether or not the two sets of image data agree with each other (FIG. 25: step S73).

If the determination result in step S73 is negative, the process proceeds to step S53 (FIG. 24), where the pick-out apparatus 50 executes processes thereafter. If, on the other hand, the determination result in step S73 is affirmative, the process proceeds to step S58 (FIG. 24), where the pick-out apparatus 50 executes processes thereafter.

With these processes, the pick-out apparatus 50 may sequentially pick out the semiconductor devices 11 while confirming that the semiconductor devices 11 to be picked out are not the semiconductor devices with marking 11b.

Similarly, the process flow diagram of FIG. 25 may also be added between steps S64 and S53. The process flow diagram of FIG. 25 may also be added between steps S42 and S43 and between steps S47 and S43 in the process flow diagram of FIG. 22.

Third Embodiment

In a third embodiment, a marking 14 is provided for the determination of a starting semiconductor device 11a while markings 14 are provided in all defective semiconductor devices 11 within an effective chip area 12 of a semiconductor substrate 10.

Figure 26B:
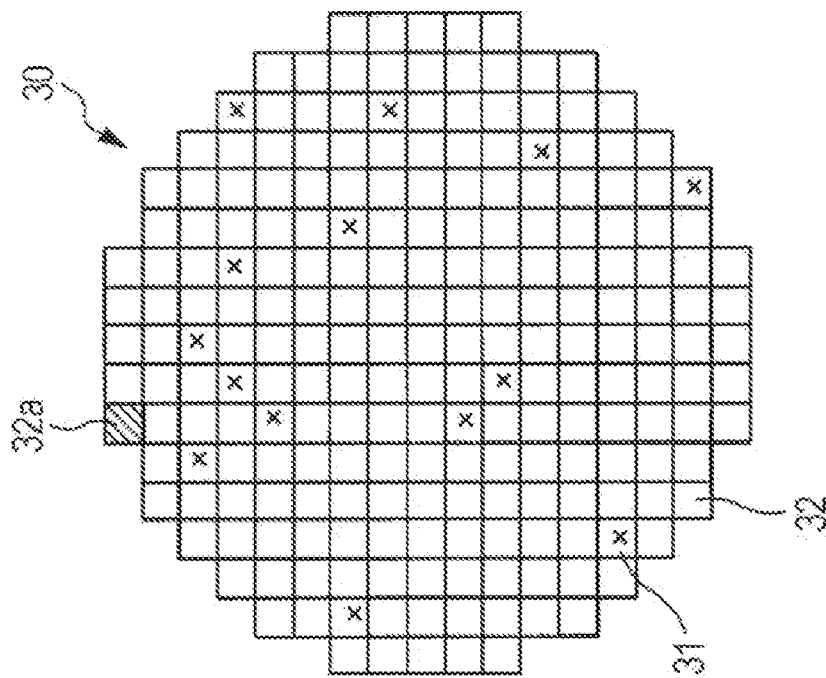
FIG. 26A illustrates an exemplary individuated semiconductor substrate and FIG. 26B illustrates exemplary map data according to a third embodiment.
Figure 26A:
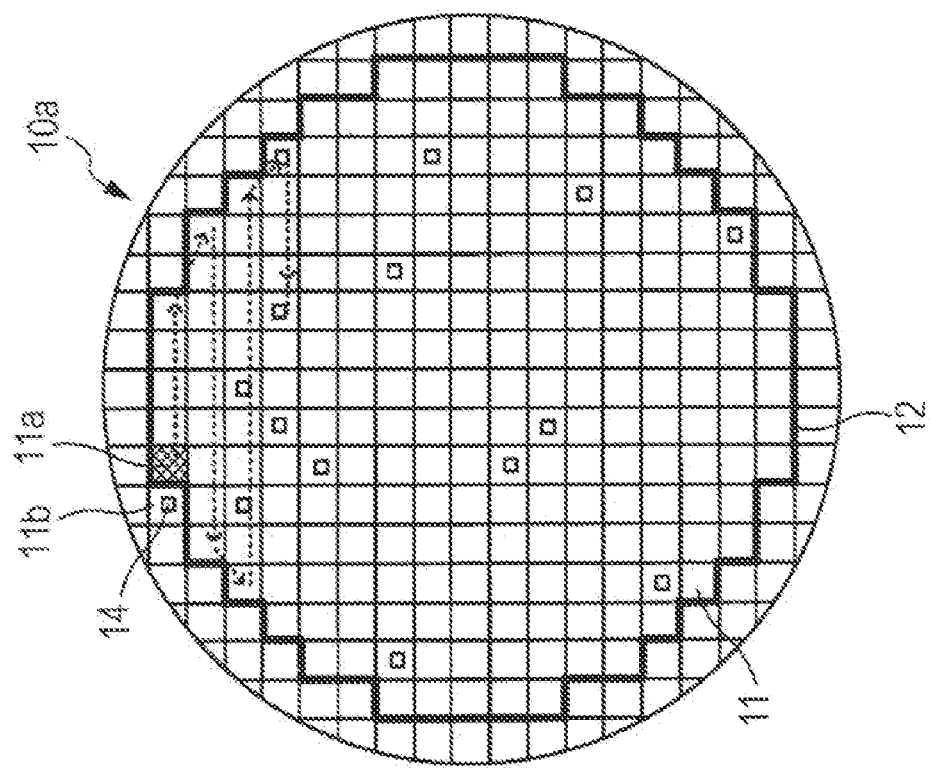

FIG. 26A illustrates an exemplary individuated semiconductor substrate 10a and FIG. 26B illustrates exemplary map data 30 obtained in association with the individuated semiconductor substrate 10a according to the third embodiment.

In the individuated semiconductor substrate 10a of the third embodiment, the markings 14 are provided on all the semiconductor devices 11 corresponding to chip locations 31 considered to be defective on the map data 30 in addition to the semiconductor device 11 adjacent to the starting semiconductor device 11a ("chip with marking" or "semiconductor device with marking 11b").

It is therefore possible to determine the starting semiconductor device 11a using the semiconductor device with marking 11b and, even if defective semiconductor devices 11 are contained in subsequent processes of the pick-out process, the containment may be reliably detected with the markings 14.

The pick-out apparatus 50 sequentially picks out the semiconductor devices 11 within the effective chip area 12 beginning with the starting semiconductor device 11a along a dotted arrow illustrated in FIG. 26A.

Figure 27:
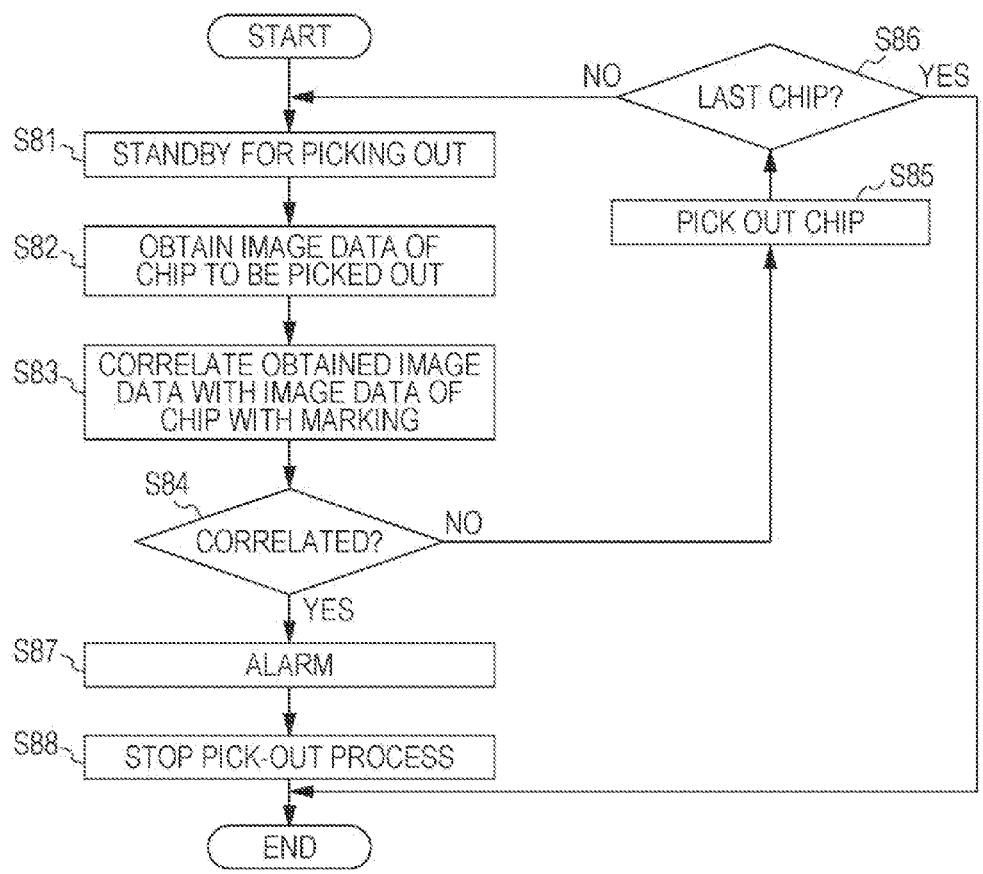
FIG. 27 is a process flow diagram of picking out a semiconductor device according to a third embodiment.

A process flow diagram of picking out the semiconductor devices 11 in a case in which the semiconductor devices with marking 11b are provided at such locations is illustrated in FIG. 27.

The pick-out apparatus 50 determines the starting semiconductor device 11a along the process flow diagram of FIG. 19 as in the first embodiment, and sequentially picks out the semiconductor devices 11 within the effective chip area 12 beginning with the starting semiconductor device 11a.

The pick-out apparatus 50 is first standing by for picking out the semiconductor devices 11 on the individuated semiconductor substrate 10a in accordance with the order of the chip locations 32 which are determined to be non-defective on the map data 30 (FIG. 27: step S81).

The pick-out apparatus 50 then obtains image data of the semiconductor device 11 to be picked out (FIG. 27: step S82). The pick-out apparatus 50 correlates the image data obtained in step S82 with the previously-stored image data of the semiconductor device with a marking 11b (FIG. 27: step S83) and determines whether or not the two sets of image data agree with each other (FIG. 27: step S84).

If the determination result in step S84 is negative, i.e., if it is confirmed that the semiconductor device 11 which is currently picked out is a semiconductor device 11 which has no marking 14 and thus has been determined to be non-defective, the pick-out apparatus 50 picks out that semiconductor device 11 (FIG. 27: step S85).

The pick-out apparatus 50 then determines whether or not the semiconductor device 11 which is currently picked out is the last semiconductor device 11 to be picked out from the individuated semiconductor substrate 10a (FIG. 27: step S86).

If the determination result in step S86 is affirmative, the picking-out process is completed. If, on the other hand, the determination result in step S86 is negative, the process returns to step S80, where the pick-out apparatus 50 and performs process thereafter.

If the determination result in step S84 is affirmative, i.e., if the semiconductor device 11 which is currently picked out is a semiconductor device with marking 11b where a non-defective semiconductor device 11 may be picked out, the pick-out apparatus 50 performs the process below.

Thus, the pick-out apparatus 50 outputs an alarm to inform an operator of abnormality (FIG. 27: step S87) and stops the picking-out process (FIG. 27: step S88).

With these processes, the pick-out apparatus 50 may sequentially pick out the semiconductor devices 11 while confirming that the semiconductor devices 11 to be picked out are not the semiconductor devices with marking 11b. Even if the semiconductor device with marking 11b is picked out, containment of defectives into subsequent processes may be reliably detected with the markings 14.

Here, the markings 14 are provided on all the defective semiconductor devices 11 within the effective chip area 12. With this, containment of semiconductor devices 11 provided with the markings 14 into subsequent processes may be detected.

A correlation between the individuated semiconductor substrate 10a and the associated map data 30 may be confirmed using the markings 14.

Here, the markings 14 are provided on the defective semiconductor device 11 next to the starting semiconductor device 11a and on the defective semiconductor devices 11 within the effective chip area 12. The markings 14, however, may also be provided on the rest of the semiconductor devices 11 outside the effective chip area 12.

In this manner, even if the semiconductor device 11 outside the effective chip area 12 is contained in subsequent processes, the containment of the defective semiconductor device may be reliably detected with the marking 14.

In this case, a process about the periphery of the effective chip area 12 illustrated in FIG. 24 may be combined with the process illustrated in FIG. 27.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. A method of manufacturing a semiconductor device, comprising:
   providing a mark on a semiconductor substrate, the providing operation including:
      forming a protective coat above the semiconductor substrate,
      irradiating a point of the semiconductor substrate with a laser beam through the protective coat, and making the mark as a depression at the point of the semiconductor substrate, and
      eliminating the protective coat from the semiconductor substrate;
   separating the semiconductor substrate into a plurality of semiconductor elements by cutting the semiconductor substrate;
   determining a reference semiconductor element on the basis of a coordinate data indicating coordinates of the mark and coordinates of all of the semiconductor elements; and
   picking-out the semiconductor elements on the basis of the coordinate data using a pick-out apparatus.
2. The method of manufacturing a semiconductor device according to claim 1, wherein
   the determination of the reference semiconductor element includes:
   selecting a location corresponding to the mark on the basis of the coordinate data,
   obtaining an image data of the selected location with a camera, comparing the image data and another image data, the another image data indicating an image of a sample mark on a semiconductor substrate, and determining one of the semiconductor elements located next to the mark as the reference semiconductor element in case that the image data and the another image data agree with each other.

3. The method of manufacturing a semiconductor device according to claim 1, further comprising:

measuring characteristics of the plurality of semiconductor elements using an evaluation equipment;

making a map data including position information of non-defective and defective semiconductor elements on the basis of the result of the measurement, wherein the non-defective semiconductor elements are picked-out among the plurality of semiconductor elements on the basis of the map data.

4. The method of manufacturing a semiconductor device according to claim 3, wherein the defective semiconductor elements are irradiated with the laser beam on the basis of the map data.

5. The method of manufacturing a semiconductor device according to claim 1, wherein the mark is provided on an outside of an effective chip area of the semiconductor substrate.

6. The method of manufacturing a semiconductor device according to claim 1, wherein a plurality of points are irradiated with the laser beam.

7. The method of manufacturing a semiconductor device according to claim 1, wherein the mark is provided on one of the semiconductor elements within an effective chip area of the semiconductor substrate.

8. The method of manufacturing a semiconductor device according to claim 1, wherein the providing operation further includes:

decreasing a thickness of the semiconductor substrate by grinding other surface of the semiconductor substrate before the irradiating operation.

* * * * *